US008258025B2

(12) United States Patent
Yamazaki et al.

(10) Patent No.: US 8,258,025 B2
(45) Date of Patent: Sep. 4, 2012

(54) METHOD FOR MANUFACTURING MICROCRYSTALLINE SEMICONDUCTOR FILM AND THIN FILM TRANSISTOR

(75) Inventors: Shunpei Yamazaki, Tokyo (JP); Yukie Suzuki, Kanagawa (JP); Yasuyuki Arai, Kanagawa (JP); Takayuki Inoue, Kanagawa (JP); Erumu Kikuchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 12/848,594

(22) Filed: Aug. 2, 2010

(65) Prior Publication Data
US 2011/0039402 A1 Feb. 17, 2011

(30) Foreign Application Priority Data

Aug. 7, 2009 (JP) ................. 2009-184856

(51) Int. Cl.
*H01L 21/00* (2006.01)
*H01L 21/20* (2006.01)
*H01L 21/36* (2006.01)
(52) U.S. Cl. . 438/158; 438/488; 438/503; 257/E31.045; 257/E31.046; 257/E29.294
(58) Field of Classification Search ............... 438/158, 438/488, 503; 257/E31.045, E31.046, E29.294
See application file for complete search history.

(56) References Cited

U.S. PATENT DOCUMENTS

| 4,409,134 A | 10/1983 | Yamazaki |
| RE34,658 E | 7/1994 | Yamazaki et al. |
| 5,453,858 A | 9/1995 | Yamazaki |
| 5,514,879 A | 5/1996 | Yamazaki |
| 5,571,366 A | 11/1996 | Ishii et al. |
| 5,591,987 A | 1/1997 | Yamazaki et al. |
| 5,614,732 A | 3/1997 | Yamazaki |
| 5,680,014 A * | 10/1997 | Miyamoto et al. ....... 315/111.41 |
| 5,701,167 A | 12/1997 | Yamazaki |
| 5,843,225 A | 12/1998 | Takayama et al. |
| 5,849,601 A | 12/1998 | Yamazaki |

(Continued)

FOREIGN PATENT DOCUMENTS

EP    1 505 174    2/2005

(Continued)

OTHER PUBLICATIONS

Arai et al., "41.2: Micro Silicon Technology for Active Matrix OLED Display," SID Digest '07: SID International Symposium Digest of Technical Papers, 2007, vol. 38, pp. 1370-1373.

(Continued)

*Primary Examiner* — Kevin Parendo
(74) *Attorney, Agent, or Firm* — Eric J. Robinson; Robinson Intellectual Property Law Office, P.C.

(57) ABSTRACT

A microcrystalline semiconductor film with high crystallinity is manufactured. In addition, a thin film transistor with excellent electric characteristics and high reliability, and a display device including the thin film transistor are manufactured with high productivity. A deposition gas containing silicon or germanium is introduced from an electrode including a plurality of projecting portions provided in a treatment chamber of a plasma CVD apparatus, glow discharge is caused by supplying high-frequency power, and thereby crystal particles are formed over a substrate, and a microcrystalline semiconductor film is formed over the crystal particles by a plasma CVD method.

16 Claims, 16 Drawing Sheets

U.S. PATENT DOCUMENTS

| | | | |
|---|---|---|---|
| 5,859,445 | A | 1/1999 | Yamazaki |
| 5,932,302 | A | 8/1999 | Yamazaki et al. |
| 6,011,277 | A | 1/2000 | Yamazaki |
| 6,023,075 | A | 2/2000 | Yamazaki |
| 6,171,674 | B1 | 1/2001 | Yamazaki et al. |
| 6,183,816 | B1 | 2/2001 | Yamazaki et al. |
| 6,218,702 | B1 | 4/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,344,420 | B1 | 2/2002 | Miyajima et al. |
| 6,468,617 | B1 | 10/2002 | Yamazaki et al. |
| 6,589,822 | B1 | 7/2003 | Yamazaki et al. |
| 6,610,142 | B1 | 8/2003 | Takayama et al. |
| 6,737,676 | B2 | 5/2004 | Yamazaki |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,576,360 | B2 | 8/2009 | Yamazaki |
| 7,700,164 | B2 | 4/2010 | Yamazaki et al. |
| 2005/0022864 | A1 | 2/2005 | Fujioka et al. |
| 2006/0238132 | A1 | 10/2006 | Kitamura et al. |
| 2008/0308807 | A1 | 12/2008 | Yamazaki et al. |
| 2009/0047774 | A1 | 2/2009 | Yamazaki |
| 2009/0047775 | A1 | 2/2009 | Yamazaki et al. |
| 2009/0072237 | A1 | 3/2009 | Yamazaki et al. |
| 2009/0233425 | A1 | 9/2009 | Furuno et al. |
| 2010/0323501 | A1* | 12/2010 | Yamazaki et al. ............ 438/479 |

FOREIGN PATENT DOCUMENTS

| | | |
|---|---|---|
| JP | 62-062073 | 12/1987 |
| JP | 02-053941 | 11/1990 |
| JP | 04-037118 | 2/1992 |
| JP | 04-242724 | 8/1992 |
| JP | 07-066132 | 3/1995 |
| JP | 11-121761 | 4/1999 |
| JP | 2000-277439 | 10/2000 |
| JP | 2004-014958 | 1/2004 |
| JP | 2004-200345 | 7/2004 |
| JP | 2005-049832 | 2/2005 |
| JP | 2005-167051 | 6/2005 |
| JP | 2006-237490 | 9/2006 |
| JP | 2007-005705 | 1/2007 |
| JP | 2007-048982 | 2/2007 |
| JP | 2009-044134 | 2/2009 |
| JP | 2009-076753 | 4/2009 |
| JP | 2009-088501 | 4/2009 |

OTHER PUBLICATIONS

Lee et al., "Leakage Current Mechanisms in Top-Gate Nanocrystalline Silicon Thin Film Transistors," Appl. Phys. Lett. (Applied Physics Letters), Feb. 28, 2008, vol. 92, pp. 083509-1-083509-3.

Esmaeili-Rad et al., "Absence of Defect State Creation in Nanocrystalline Silicon Thin Film Transistors Deduced from Constant Current Stress Measurements," Appl. Phys. Lett. (Applied Physics Letters), Sep. 12, 2007, vol. 91, No. 11, pp. 113511-1-113511-3.

Lee et al., "Stability of nc-Si:H TFTs With Silicon Nitride Gate Dielectric," IEEE Transactions on Electron Devices, Jan. 2007, vol. 54, No. 1, pp. 45-51.

Sazonov et al., "Low-Temperature Materials and Thin Film Transistors for Flexible Electronics," Proceedings of the IEEE, Aug. 1, 2005, vol. 93, No. 8, pp. 1420-1428.

Esmaeili-Rad et al., "Stability of Nanocrystalline Silicon Bottom-Gate Thin Film Transistors with Silicon Nitride Gate Dielectric," J. Appl. Phys. (Journal of Applied Physics), Sep. 28, 2007, vol. 102, No. 6, pp. 064512-1-064512-7.

Lee et al., "Top-Gate TFTs Using 13.56 MHz PECVD Microcrystalline Silicon," IEEE Electron Device Letters, Sep. 5, 2005, vol. 26, No. 9, pp. 637-639.

Lee et al., "Postdeposition Thermal Annealing and Material Stability of 75 °C Hydrogenated Nanocrystalline Silicon Plasma-Enhanced Chemical Vapor Deposition Films," J. Appl. Phys. (Journal of Applied Physics), Aug. 4, 2005, vol. 98, No. 3, pp. 034305-1-034305-7.

* cited by examiner

FIG. 14A
FIG. 14B
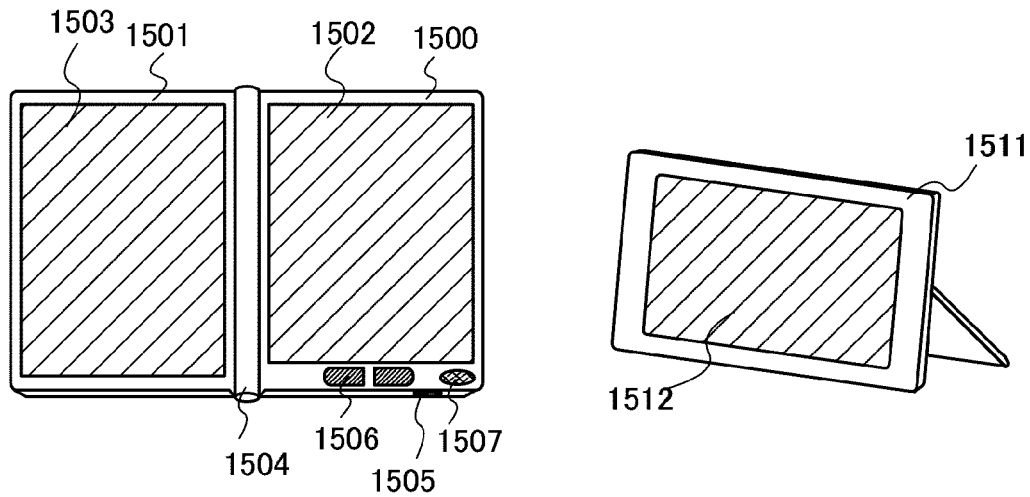
FIG. 14C
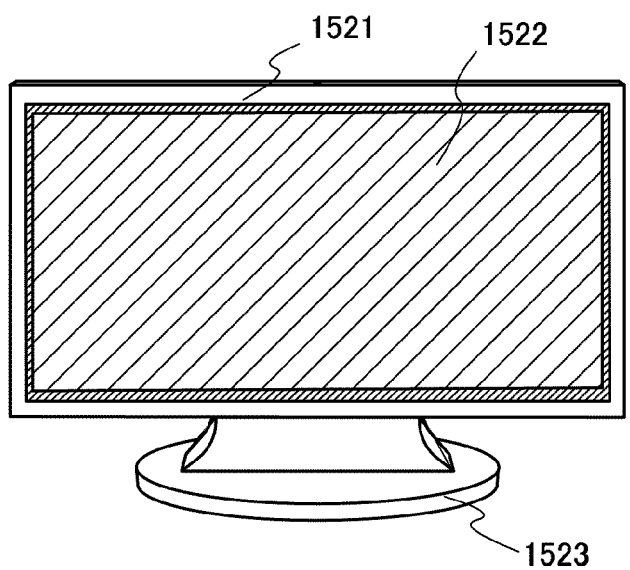
FIG. 14D
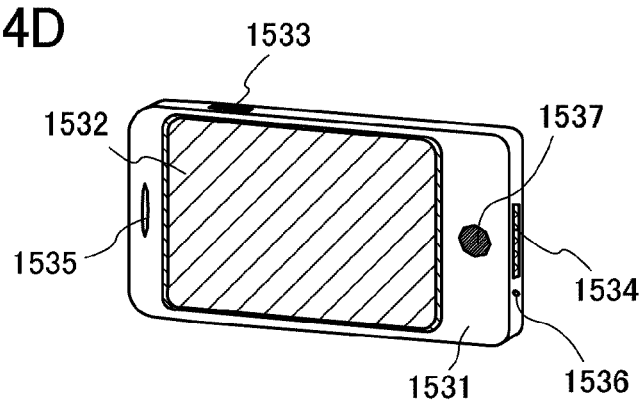

METHOD FOR MANUFACTURING MICROCRYSTALLINE SEMICONDUCTOR FILM AND THIN FILM TRANSISTOR

BACKGROUND OF THE INVENTION

1. Field of the Invention

The present invention relates to a microcrystalline semiconductor film and a thin film transistor, a manufacturing method thereof, and a display device to which the thin film transistor is applied.

2. Description of the Related Art

As one type of field-effect transistor, a thin film transistor whose channel formation region is formed using a semiconductor film that is formed over a substrate having an insulating surface is known. Techniques in which microcrystalline silicon is used for the semiconductor film in the thin film transistor have been disclosed (see Patent Documents 1 to 3). A typical application of the thin film transistor is a liquid crystal television device, in which the thin film transistor has been put to practical use as a switching transistor for each pixel that constitutes a display screen.

[Reference]
[Patent Document]
[Patent Document 1] Japanese Published Patent Application No. 2009-044134
[Patent Document 2] Japanese Published Patent Application No. 2009-088501
[Patent Document 3] Japanese Published Patent Application No. 2009-076753

SUMMARY OF THE INVENTION

An inversely-staggered thin film transistor in which a microcrystalline semiconductor film is used for a channel formation region has problems in that crystallinity of the microcrystalline semiconductor film in an interface region between a gate insulating film and the microcrystalline semiconductor film is low and electric characteristics of the thin film transistor are poor.

In view of the above-mentioned problems, an object of one embodiment of the present invention is to manufacture a microcrystalline semiconductor film with high crystallinity. Further, another object of one embodiment of the present invention is to manufacture a thin film transistor with excellent electric characteristics and high reliability and a display device including the thin film transistor, with high productivity.

According to one embodiment of the present invention, a deposition gas containing silicon or germanium is introduced from an electrode including a plurality of projecting portions provided in a treatment chamber of a plasma CVD apparatus, high-frequency power is supplied, and glow discharge is caused to form crystal particles over a substrate, over which a microcrystalline semiconductor film is formed by a plasma CVD method.

By introducing the deposition gas containing silicon or germanium from the electrode including the plurality of projecting portions provided in the treatment chamber of the plasma CVD apparatus, supplying high-frequency power, and causing glow discharge to generate plasma with high electron density around the projecting portions of the electrode, the crystal particles can be formed around the projecting portions to be deposited over a base film formed over the substrate. Further, by forming the microcrystalline semiconductor film over the crystal particles and the base film using a plasma CVD method, crystals can be grown using the crystal particles as crystal nuclei, and a microcrystalline semiconductor film with high crystallinity from an interface with the base film can be formed.

Further, by forming a gate electrode over the substrate, forming the base film as a gate insulating film over the gate electrode, forming the microcrystalline semiconductor film over the gate insulating film, and forming a wiring connected to the microcrystalline semiconductor film, a microcrystalline semiconductor film with high crystallinity from an interface with the gate insulating film can be formed. Since the microcrystalline semiconductor film functions as a channel formation region, a thin film transistor with excellent electric characteristics and high reliability can be manufactured.

Note that here, a concentration is measured by secondary ion mass spectrometry (SIMS) unless a method for measuring the concentration is mentioned.

Note that on-current refers to a current which flows between a source electrode and a drain electrode when a thin film transistor is on. For example, in the case of an n-channel thin film transistor, the on-current refers to a current which flows between a source electrode and a drain electrode when a gate voltage is higher than a threshold voltage of the thin film transistor.

In addition, off-current refers to a current which flows between a source electrode and a drain electrode when a thin film transistor is off. For example, in the case of an n-channel thin film transistor, off-current refers to a current which flows between a source electrode and a drain electrode when gate voltage is lower than a threshold voltage of the thin film transistor.

As described above, a microcrystalline semiconductor film with high crystallinity can be manufactured. Further, a thin film transistor with small off-current and large on-current can be manufactured with high productivity.

BRIEF DESCRIPTION OF THE DRAWINGS

FIGS. 14A to 14D are views each illustrating an electronic device to which a thin film transistor is applied.

DETAILED DESCRIPTION OF THE INVENTION

Figure 1A:
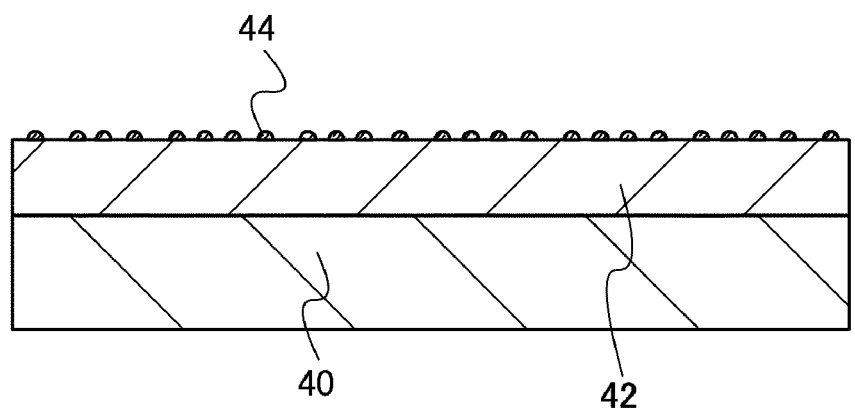
FIGS. 1A and 1B are cross-sectional views illustrating a method for manufacturing a microcrystalline semiconductor film.

Hereinafter, embodiments are described in detail using the drawings. Note that the disclosed invention is not limited to the following description and it will be easily understood by those skilled in the art that various changes and modifications can be made in modes and details without departing from the spirit and the scope of the disclosed invention. Therefore, the disclosed invention is not interpreted as being limited to the description of the embodiments below. Note that in structures of the invention described hereinafter, the same portions or portions having similar functions are denoted by the same reference numerals in different drawings, and description thereof is not repeated.

(Embodiment 1)

In this embodiment, a method for forming a microcrystalline semiconductor film with high crystallinity is described with reference to FIGS. 1A and 1B, FIG. 2, FIG. 3, FIG. 4 and FIG. 5.

Figure 1B:
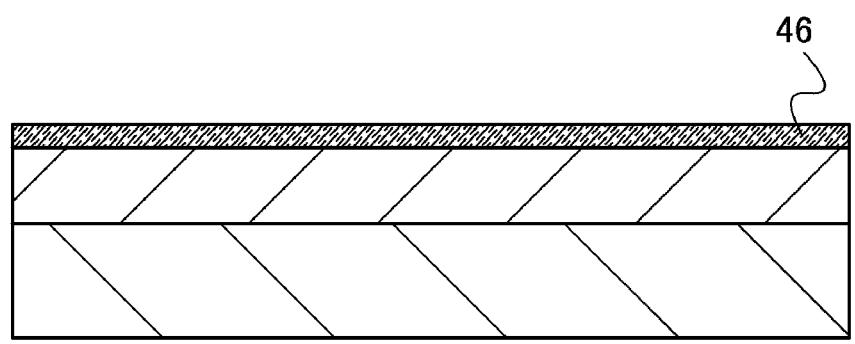

In a method for forming a microcrystalline semiconductor film shown in this embodiment, crystal particles 44 (also referred to as nanoparticles) are formed over a base film 42 formed over a substrate 40 as shown in FIG. 1A. Next, by depositing a microcrystalline semiconductor film over the base film 42 and the crystal particles 44, crystals are grown using the crystal particles 44 as crystal nuclei, whereby a microcrystalline semiconductor film 46 can be formed, as shown in FIG. 1B.

The crystal particle 44 is crystalline silicon, crystalline germanium, crystalline silicon germanium, or the like having a crystal grain size of several nanometers. The crystal particle 44 includes therein a crystallite which is a minute crystal regarded as a single crystal. Further, the crystal particle 44 may include a twin crystal. Therefore, when active species dissociated in plasma reach the crystallite, crystal grows using the crystallite as a crystal nucleus, so that the microcrystalline semiconductor film 46 with high crystallinity from an interface with the base film can be formed.

Note that a material and a structure of the substrate 40 and the base film 42 can be selected to be used as appropriate.

Now, a plasma CVD apparatus by which the crystal particles 44 can be formed which is a feature of this embodiment is described with reference to FIG. 2, FIG. 3, FIG. 4, and FIG. 5.

Figure 2:
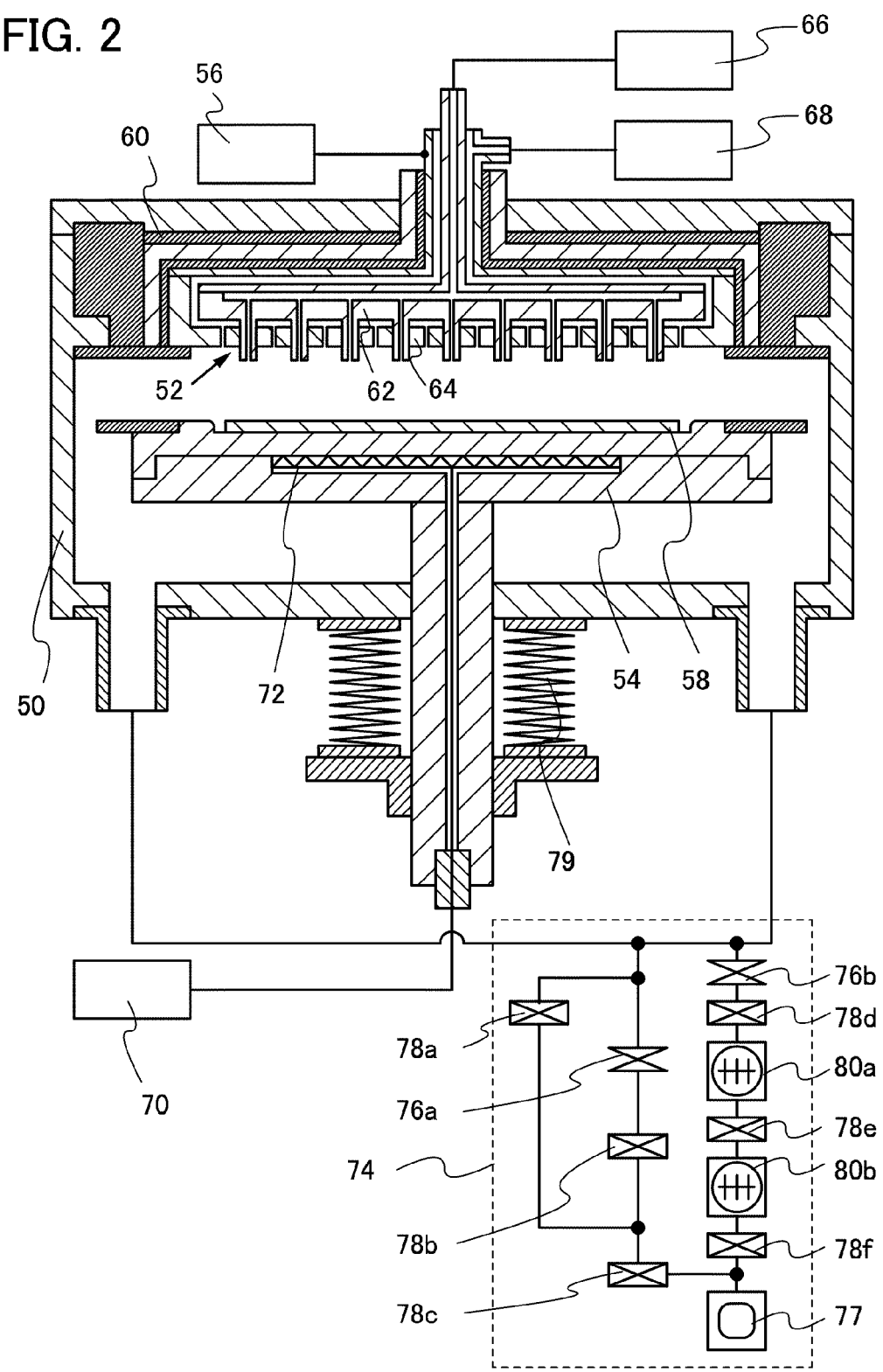
FIG. 2 is a cross-sectional view illustrating a reaction chamber of a plasma CVD apparatus.

FIG. 2 shows a structure of a reaction chamber of a plasma CVD apparatus. A reaction chamber 50 is formed with a material having rigidity, such as aluminum or stainless steel, and is structured so that the inside can be vacuum evacuated. The reaction chamber of the plasma CVD apparatus in this embodiment is formed using stainless steel in order to increase its mechanical strength, and the inside thereof is coated with aluminum by thermal spraying. In addition, the reaction chamber of the plasma CVD apparatus in this embodiment can be disassembled for maintenance, and thereby the inside of the reaction chamber can be regularly recoated with aluminum by thermal spraying. The reaction chamber 50 is provided with a first electrode 52 (also referred to as an upper electrode) and a second electrode 54 (also referred to as a lower electrode) which is opposite to the first electrode 52.

A high-frequency power supply means 56 is connected to the first electrode 52. The second electrode 54 on which a substrate 58 can be placed is grounded. The first electrode 52 is insulated from the reaction chamber 50 by an insulating material 60 so that high-frequency power does not leak. In the case where a ceramic material is used for the insulating material 60, it is difficult to use a knife-edge-type metal-seal flange for sealing of the upper electrode, and thus, an O-ring seal is preferably used.

Also, FIG. 2 shows a capacitively coupled type structure (a parallel plate type structure) including the first electrode 52 and the second electrode 54, but is not limited thereto. Another structure such as an inductively coupled type structure may be employed as long as glow discharge plasma can be generated in the reaction chamber 50 by supplying high-frequency power.

The first electrode 52 includes a plate electrode member 64 and a projecting electrode member 62 projected from a flat surface of the plate electrode member 64. In FIG. 2, a hollow portion is formed inside the projecting electrode member 62 of the first electrode 52, into which a gas supplied from a gas supply portion 66 flows. In addition, a hollow portion is formed inside the plate electrode member 64 of the first electrode 52, into which a gas supplied from a gas supply portion 68 flows. With such a structure, the kinds of gases supplied to the reaction chamber 50 from the projecting electrode member 62 and the plate electrode member 64 can be different. Further, flow rates or dilution ratios of the gases supplied into the reaction chamber 50 from the projecting electrode member 62 and the plate electrode member 64 can be different. Furthermore, timings of supplying the gases into the reaction chamber 50 from the projecting electrode member 62 and the plate electrode member 64 can be different.

The gas supply portion 66 and the gas supply portion 68 each include a cylinder filled with a gas, a pressure adjusting valve, a stop valve, a mass flow controller, and the like. The gas supply portion 66 and the gas supply portion 68 each include a cylinder filled with a deposition gas containing silicon or germanium. Alternatively, a cylinder filled with hydrogen or a cylinder filled with a rare gas may be included. As examples of the deposition gas containing silicon or germanium, a silane ($SiH_4$) gas, a disilane ($Si_2H_6$) gas, a silane fluoride ($SiF_4$) gas, a germane ($GeH_4$) gas, a digermane ($Ge_2H_6$) gas, a germane fluoride ($GeF_4$) gas, and the like are given; however, any other deposition gas may be used. As a dilution gas, helium, neon, argon, krypton, xenon, and the like are given.

A substrate heater 72, a temperature of which is controlled by a heater controller 70, is provided inside the second electrode 54. In the case where the substrate heater 72 is provided inside the second electrode 54, a thermal conduction heating method is employed. For example, a sheathed heater is used for the substrate heater 72.

The high-frequency power supply means 56 includes a high-frequency power source, a matching box, a high-frequency cut filter, and the like. High-frequency power supplied from the high-frequency power source is supplied to the first electrode 52.

The high-frequency power source oscillates high-frequency power with a frequency of 60 MHz or less. In the case where a large substrate of the seventh or later generation is used as a substrate placed on the second electrode 54, the high-frequency power source preferably oscillates high-frequency power with a wavelength of approximately 10 m or more. Typically, high-frequency power with a frequency of 13.56 MHz or less, preferably of 1 MHz to 13.56 MHz inclusive is preferably oscillated. When the high-frequency power source oscillates high-frequency power with a frequency in the above range, even if a large substrate of the seventh or later generation is placed on the second electrode 54 and glow discharge is performed, plasma can be generated uniformly over the large substrate without an adverse effect of a surface standing wave; therefore, a film which is uniform and has good film quality can be formed over an entire surface of the substrate.

In addition, when a power source with a frequency of 13.56 MHz is used for the high-frequency power source, a variable capacitor with a capacitance of 10 pF to 100 pF is used for the high-frequency cut filter. By further using a coil for the high-frequency cut filter, a parallel resonance circuit using a coil and a variable capacitor may be formed.

An evacuation means 74 connected to the reaction chamber 50 has a function of vacuum evacuation and a function of controlling the reaction chamber 50 to be kept at a predetermined pressure in the case where a reaction gas is made to flow. The evacuation means 74 includes butterfly valves 76a and 76b, stop valves 78a to 78f, turbo molecular pumps 80a and 80b, a dry pump 77, and the like. Note that the turbo molecular pump 80b is connected to the dry pump 77 through the stop valve 78f.

In the case of performing vacuum evacuation in the reaction chamber 50, first, the stop valves 78a and 78c for rough vacuum are opened, and the reaction chamber 50 is evacuated with the dry pump 77. Then, the stop valve 78a is closed, and the butterfly valve 76a and the stop valve 78b are opened to perform vacuum evacuation. In the case of performing ultra-high vacuum evacuation to obtain a pressure lower than $10^{-5}$ Pa in the reaction chamber 50, the reaction chamber 50 is evacuated with the dry pump 77 as described above, the butterfly valve 76a and the stop valves 78b and 78c are closed, the butterfly valve 76b and the stop valves 78d to 78f are opened, and then vacuum evacuation is performed using the turbo molecular pumps 80a and 80b and the dry pump 77 which are connected in series. In addition, after the vacuum evacuation is performed, the reaction chamber 50 is preferably subjected to heat treatment so that degassing of an inner wall is performed.

A distance (also referred to as a gap) between the first electrode 52 and the second electrode 54 can be changed as appropriate. The gap between the electrodes can be adjusted in such a manner that the height of the second electrode 54 is adjusted in the reaction chamber 50. By using a bellows 79, the gap between the electrodes can be adjusted with the reaction chamber 50 maintained in a vacuum.

Figure 3:
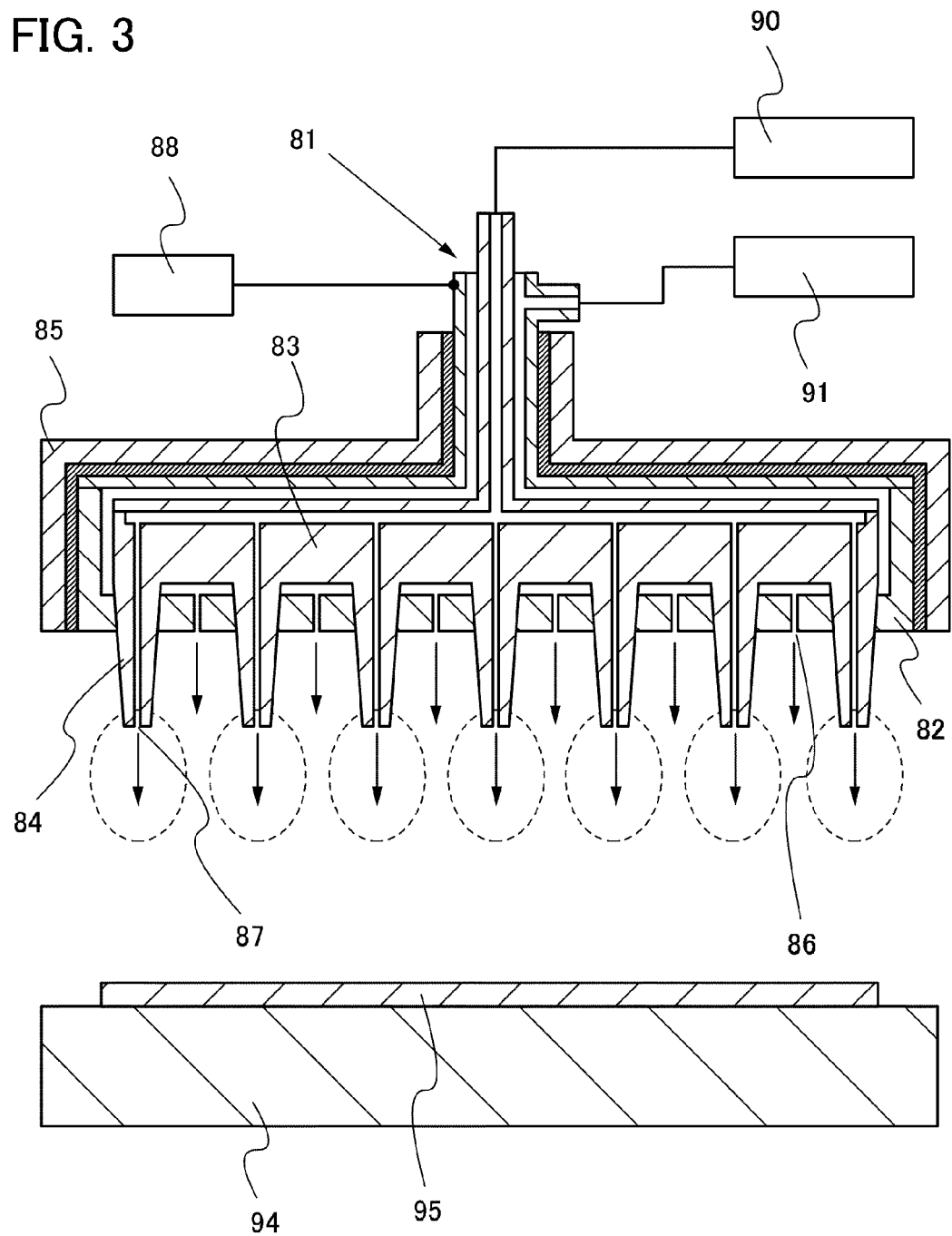
FIG. 3 is a cross-sectional view illustrating a structure of an electrode for generating plasma, which is provided in the reaction chamber of the plasma CVD apparatus.
Figure 5:
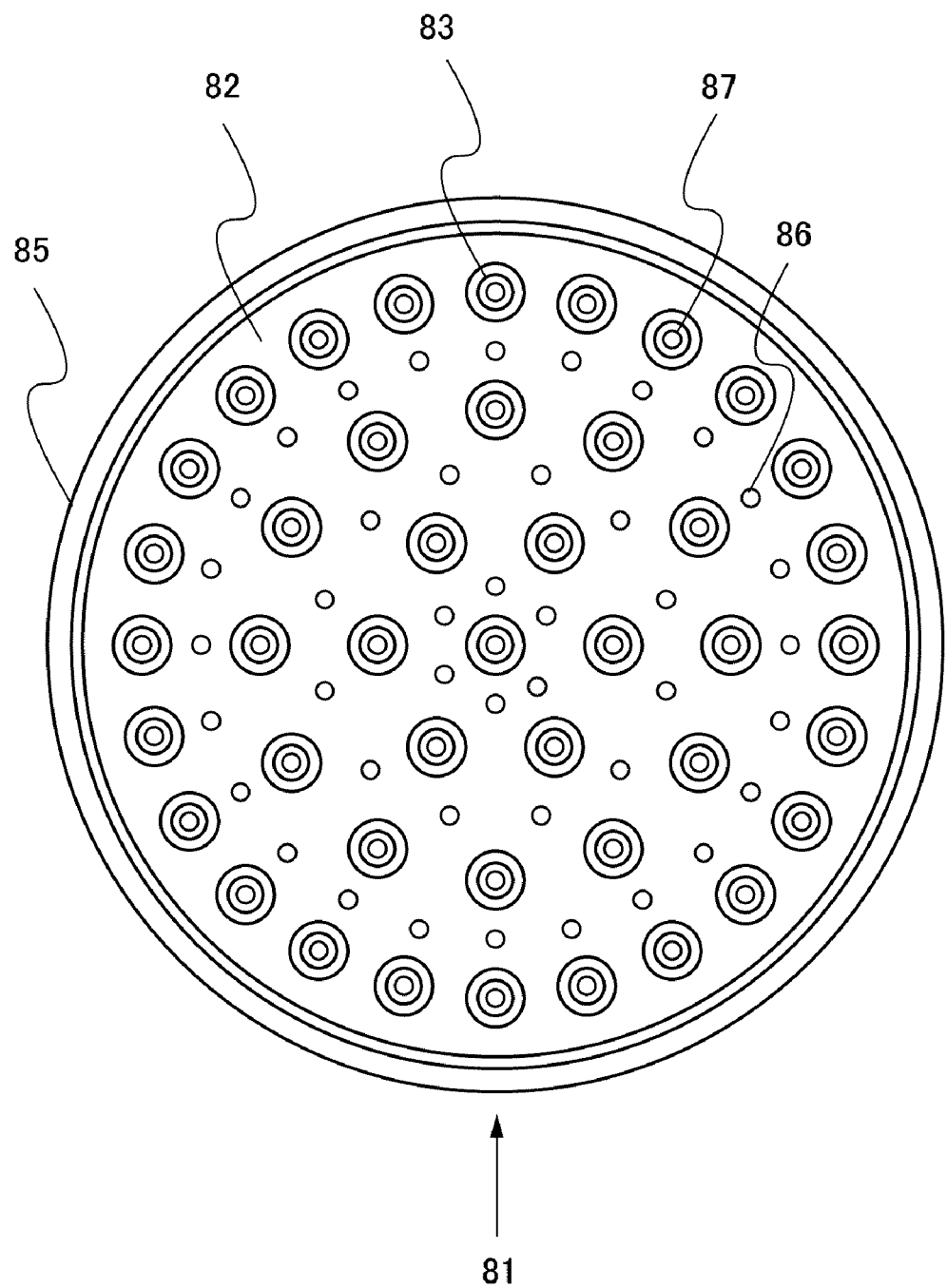
FIG. 5 is a plan view illustrating the structure of the electrode for generating plasma, which is provided in the reaction chamber of the plasma CVD apparatus.

Next, an electrode for generating plasma provided in the reaction chamber of the plasma CVD apparatus is explained with reference to drawings. FIG. 3 is a cross-sectional view illustrating a structure of the first electrode provided in the plasma CVD apparatus, and FIG. 5 is a plan view thereof. The following description will be given with reference to FIG. 3 and FIG. 5.

A first electrode 81 includes a plate electrode member 82 and a projecting electrode member 83 projected from a flat surface of the plate electrode member 82. The plate electrode member 82 and the projecting electrode member 83 are formed of a metal material to have conductivity. The plate electrode member 82 and the projecting electrode member 83 are electrically connected to each other and act so as to generate plasma (glow discharge plasma) in the reaction chamber of the plasma CVD apparatus with power supplied from a high-frequency power source 88. A back surface of the plate electrode member 82 (a surface opposite to a surface where a projecting portion of the projecting electrode member 83 is projected) is provided with an electrode hood 85 so that plasma does not spread over a wall surface of the reaction chamber.

The first electrode 81 has a structure in which a projecting electrode 84 of the projecting electrode member 83 is projected from the flat surface of the plate electrode member 82, and the other parts of the projecting electrode member 83 are provided inside the plate electrode member 82.

A hollow portion is provided between the plate electrode member 82 and the projecting electrode member 83 so that a gas supplied from a gas supply portion 91 flows thereinto. The gas supplied to the hollow portion from the gas supply portion 91 flows into the reaction chamber from a gas supply port 86.

A hollow portion is also formed in the projecting electrode member 83, into which a gas supplied from a gas supply portion 90 flows. The projecting electrode 84 of the projecting electrode member 83 is provided with a gas supply port 87 so that the gas supplied from the gas supply portion 90 flows into the reaction chamber.

As described above, when a double hollow structure is provided in the first electrode 81, different reaction gases can be supplied into the reaction chamber of the plasma CVD apparatus through different paths.

This first electrode 81 is provided with the plate electrode member 82 and the projecting electrode member 83. Electric power is supplied to the plate electrode member 82 and the projecting electrode member 83, whereby plasma (glow discharge plasma) is generated in the reaction chamber of the plasma CVD apparatus. Distribution of plasma generated by the first electrode 81 can be made different in a peripheral region of the projecting electrode 84. This is because the projecting electrode 84 is projected from the flat surface of the plate electrode member 82. The projecting electrode 84 is projected from the flat surface of the plate electrode member 82 to act so as to increase plasma density by electric field concentration. The projecting electrode 84 acts so as to increase an electron temperature. In addition, such a structure can alleviate an adverse effect of a surface standing wave generated in the case where the size of a plate electrode is increased to about a wavelength of a discharge frequency. This is because the projecting electrode 84 generates plasma independently of a flat surface which is a surface of the plate electrode member 82.

With such a structure of the first electrode 81, a particular reaction gas can be supplied to a region with high plasma density. By employing the structure of the first electrode 81, a particular deposit precursor can be selectively generated, which allows a composition and/or a structure of a deposited film to be controlled.

Figure 4:
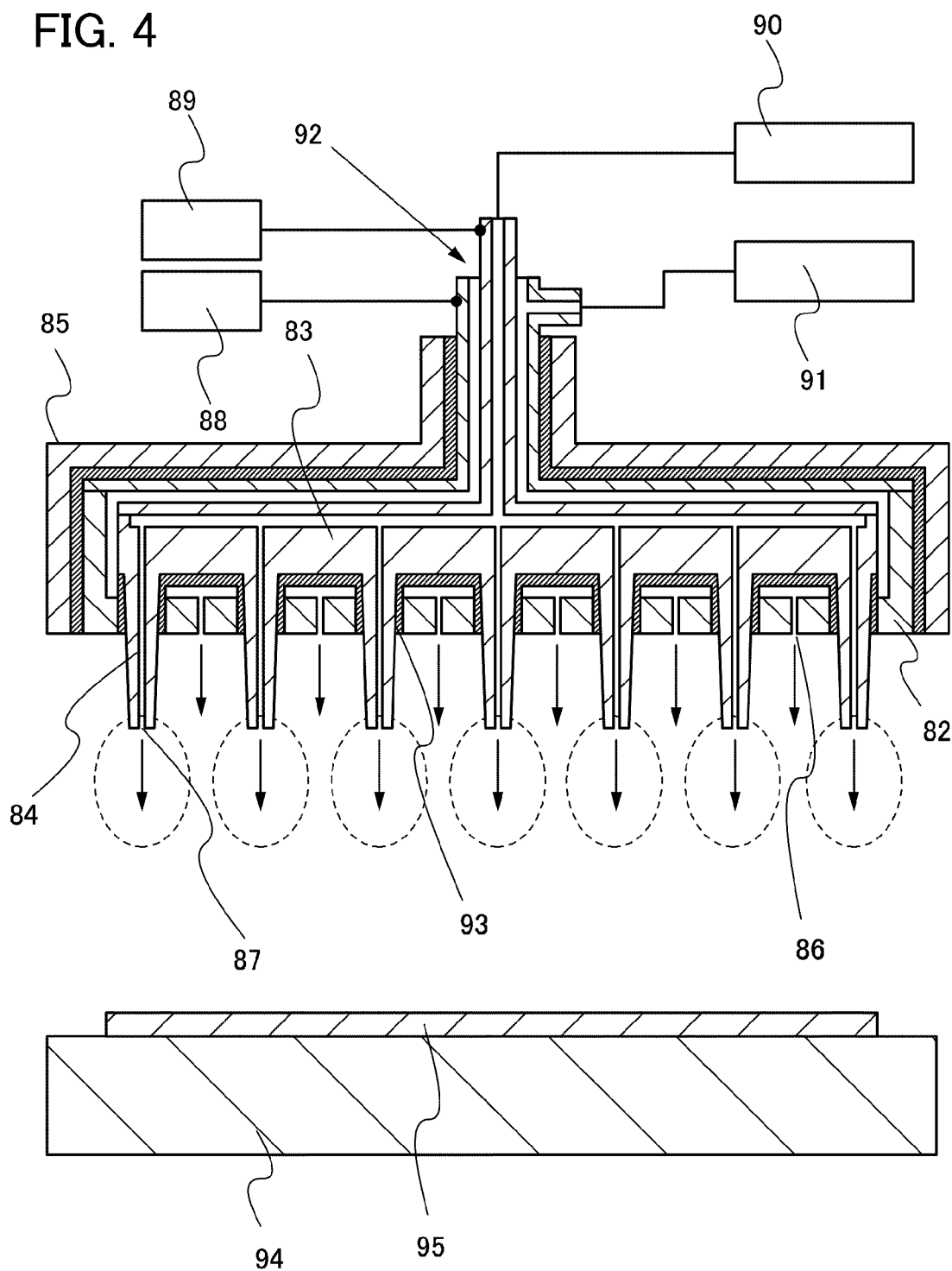
FIG. 4 is a cross-sectional view illustrating a structure of an electrode for generating plasma, which is provided in the reaction chamber of the plasma CVD apparatus.

FIG. 4 shows a structure of a first electrode 92 in which an insulating member 93 electrically insulates the plate electrode member 82 from the projecting electrode member 83. With such a structure, different electric power can be supplied to the plate electrode member 82 and the projecting electrode member 83 to generate plasma. For example, electric power can be supplied to the plate electrode member 82 from a high-frequency power source 88, and electric power can be supplied to the projecting electrode member 83 from a high-frequency power source 89. Note that the planar structure of the first electrode 92 is similar to that shown in FIG. 5.

As a method for supplying electric power to the first electrode 92, for example, high-frequency power with a frequency of 1 MHz or more and less than 30 MHz (for example, 13.56 MHz or 27 MHz) is supplied to the plate electrode member 82 from the high-frequency power source 88, and high-frequency power with a frequency of 30 MHz to 150 MHz inclusive is supplied to the projecting electrode member 83 from the high-frequency power source 89. Further, continuous wave high-frequency power is supplied to the plate electrode member 82 from the high-frequency power source 88, and pulsed wave high-frequency power is supplied to the projecting electrode member 83 from the high-frequency power source 89.

With such a structure of the first electrode 92, when a particular reaction gas is supplied to a region with high plasma density to selectively generate a particular deposit precursor, the amount of the generated precursor and a timing of generating the precursor can be controlled independently.

Note that a supplying path of the reaction gas, a structure of the projecting electrode 84, and the like of the first electrode 92 are similar to those of the first electrode 81 shown in FIG. 3.

In the case where the first electrode 81 shown in FIG. 3 and the first electrode 92 shown in FIG. 4 are used for a capacitively-coupled plasma CVD apparatus, a region with high plasma density can be formed in the reaction chamber.

When a deposition gas is supplied to the region with high plasma density in a deposition process of a thin film, gas molecules are dissociated to generate radicals. In the region with high plasma density, short-life active radicals are generated, which react in a gas phase to form nuclei. When the nuclei are formed, reaction proceeds successively in the gas phase, and particles of nanometer size (hereinafter, also referred to as nanoparticles) can be grown. Note that at the first electrode 81 and the first electrode 92 of this embodiment, plasma (glow discharge plasma) is generated also on the flat plate of the plate electrode member 82; therefore, deposition of a thin film over a substrate is possible in addition to generation of the nanoparticles as described above.

When nuclei of nanoparticles are generated, high-order radicals are attached to the nuclei to grow nanoparticles. Since the higher-order radicals necessary for generating nuclei are consumed in growth of the nuclei, generation of new nuclei is suppressed. Therefore, the size and the amount of generated nanoparticles can be controlled by controlling time while electric power is supplied to the projecting electrode member 83 (for example, a pulse width and a pulse frequency of pulsed wave electric power), a gas flow, a gas evacuation rate, and a pressure in the reaction chamber. When a distance between the first electrode 81 or the first electrode 92 and a counter electrode 94 on which a substrate 95 is positioned is short, discharge is possible even in the case where the pressure of the reaction chamber is relatively high (for example, 1000 Pa). In the case where the pressure is high in the reaction chamber, a probability of reaction of the generated nuclei and a base gas (for example, silane) increases, by which generation of nanoparticles is promoted.

A composition of the nanoparticle can be controlled by selecting a gas to be supplied. This is because the radicals generated in plasma are different depending on the kinds of the gas. Therefore, by changing the kind of a deposition gas during the growth of nanoparticles, multiple-layered nanoparticles can be generated as well.

Since nanoparticles are negatively charged easily in plasma, aggregation of nanoparticles is controlled by Coulomb's force. Therefore, a large number of nanoparticles which are almost monodispersed can be obtained by the plasma CVD apparatus in this embodiment.

In the structure of the nanoparticles, the temperature of nanoparticles is important in addition to the kind of radicals which contribute to growth. The temperature of the nanoparticles is determined by influence of kinetic energy of an electron and an ion incident on the surface (surfaces of the nanoparticles), discharge or absorption of energy by chemical reaction on the surface, heating or cooling by collision of neutral gas molecules, or the like.

For example, in the case where silicon nanoparticles are generated, silane ($SiH_4$) is diluted with hydrogen, whereby a crystalline structure can be formed. This is considered to be a mechanism similar to the surface reaction in the case of depositing a microcrystalline silicon film. Reaction of hydrogen and radicals generated by dissociation of silane is considered to mainly contribute to generation of silicon nanoparticles including a crystalline structure.

In this case, a silane gas or a silane gas diluted with hydrogen is supplied from the gas supply port 87, and hydrogen is supplied from the gas supply port 86. Such a gas supplying method promotes crystallization of nanoparticles. Further, when a silane gas or a silane gas diluted with hydrogen is supplied from the gas supply port 86, growth of nanoparticles is promoted to increase a deposition rate of a film deposited over the substrate 95. On the other hand, when a rare gas such as xenon, krypton, or argon is supplied from the gas supply port 86, excited species of the rare gas promotes decomposition of silane to contribute to generation of high-order radicals.

In this manner, crystalline nanoparticles formed in a gas phase can be transported to a surface of a substrate to be used as nuclei of crystal growth over the substrate. In addition, a deposited film can include crystalline nanoparticles. Further, when a microcrystalline semiconductor film is deposited over the crystalline nanoparticles, crystals grow from an interface with a base film using the nanoparticles as crystal nuclei; therefore, a microcrystalline semiconductor film with high crystallinity from the interface with the base film can be formed.

(Embodiment 2)

In this embodiment, a structure of a thin film transistor including a microcrystalline semiconductor film formed by the method described in Embodiment 1 is described with reference to FIGS. 6A to 6C.

The microcrystalline semiconductor film formed by the method described in Embodiment 1 can be used for a channel formation region of the thin film transistor. As the thin film transistor, both a bottom-gate thin film transistor and a top-gate thin film transistor can be used; however, characteristics of the thin film transistor can be improved by using a bottom-gate thin film transistor in particular. Here, a typical structure of a bottom-gate thin film transistor is explained with reference to FIGS. 6A to 6C.

Figure 6A:
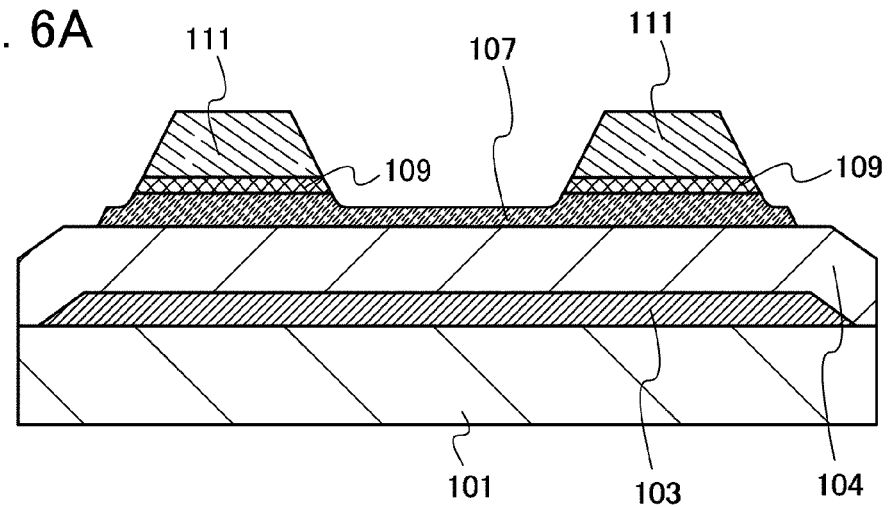
FIGS. 6A to 6C are cross-sectional views each illustrating one mode of a structure of a thin film transistor.

A thin film transistor shown in FIG. 6A is a channel-etched thin film transistor. A gate electrode 103 is formed over a substrate 101, and a gate insulating film 104 is formed to cover the substrate 101 and the gate electrode 103. A microcrystalline semiconductor film 107 is formed over the gate insulating film 104. A pair of impurity semiconductor films 109 are formed over the microcrystalline semiconductor film 107. Further, wirings 111 are formed in contact with the pair of impurity semiconductor films 109. When the microcrystalline semiconductor film 107 is formed using the method for forming a microcrystalline semiconductor film described in Embodiment 1, a channel formation region can be formed using a microcrystalline semiconductor film with high crystallinity, whereby the on-current and the field effect mobility of the thin film transistor are increased. In addition, since crystal grains of the microcrystalline semiconductor film are adjacent to each other at a large contact area, carriers can move easily in the channel formation region to increase the on-current and the field effect mobility of the thin film transistor.

As the substrate 101, in addition to a glass substrate and a ceramic substrate, a plastic substrate or the like with heat resistance which can withstand a process temperature in this manufacturing process can be used. In the case where the substrate does not need a light-transmitting property, a substrate in which an insulating film is provided over a surface of a substrate of a metal such as a stainless steel alloy may be used. As a glass substrate, an alkali-free glass substrate of barium borosilicate glass, aluminoborosilicate glass, aluminosilicate glass, or the like may be used. Further, as for the substrate 101, a glass substrate with any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 103 can be formed in a single layer or a stacked layer using a metal material such as molybdenum, titanium, chromium, tantalum, tungsten, aluminum, copper, neodymium, or scandium or an alloy material which contains any of these materials as its main component. Alternatively, a semiconductor film typified by polycrystalline silicon doped with an impurity element such as phosphorus, or an AgPdCu alloy may be used.

As a two-layer structure of the gate electrode 103, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked is preferable. As a three-layer structure of the gate electrode 103, a three-layer structure of a tungsten film or a tungsten nitride film, a layer of an alloy of aluminum and silicon or an alloy of aluminum and titanium, and a titanium nitride film or a titanium film is preferable. When a metal film functioning as a barrier film is stacked over a film with low electric resistance, electric resistance can be reduced and a metal element from the metal film can be prevented from diffusing into the semiconductor film.

In order to improve adhesion between the gate electrode 103 and the substrate 101, a film of a nitride of any of the aforementioned metal materials may be provided between the substrate 101 and the gate electrode 103.

The gate insulating film 104 can be formed in a single layer or a stacked layer using any of a silicon oxide film, a silicon nitride film, a silicon oxynitride film, and a silicon nitride oxide film.

In this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The microcrystalline semiconductor film 107 is typically formed using a microcrystalline silicon film, a microcrystalline silicon germanium film, a microcrystalline germanium film, or the like. Alternatively, a microcrystalline silicon film containing phosphorus, arsenic, or antimony, a microcrystalline silicon germanium film containing phosphorus, arsenic, or antimony, a microcrystalline germanium film containing phosphorus, arsenic, or antimony, or the like may be used. Note that boron may be added to the microcrystalline semiconductor film 107 to control threshold voltage of the thin film transistor.

A microcrystalline semiconductor included in the microcrystalline semiconductor film is a semiconductor having a crystalline structure (including a single crystal and a polycrystal). The microcrystalline semiconductor is a semiconductor having a third state that is stable in terms of free energy and is a crystalline semiconductor having short-range order and lattice distortion, in which columnar, or conical or pyramidal crystals having a grain size of from 2 nm to 200 nm inclusive, preferably from 10 nm to 80 nm inclusive, more preferably from 20 nm to 50 nm inclusive have grown in a normal direction with respect to a substrate surface. Therefore, a crystal grain boundary is formed at the interface of the columnar, or conical or pyramidal crystals in some cases.

Microcrystalline silicon which is a typical example of the microcrystalline semiconductor has a peak of a Raman spectrum which is shifted to a lower wave number than 520 $cm^{-1}$ that represents single crystal silicon. That is, the peak of the Raman spectrum of the microcrystalline silicon exists between 520 $cm^{-1}$ which represents single crystal silicon and 480 $cm^{-1}$ which represents amorphous silicon. The microcrystalline semiconductor may contain hydrogen or halogen of at least 1 at. % to terminate a dangling bond. Moreover, a rare gas element such as helium, neon, argon, krypton, or xenon may be contained to further promote lattice distortion, so that stability of the structure of minute crystals is enhanced and a favorable microcrystalline semiconductor can be obtained. Such a microcrystalline semiconductor is disclosed in, for example, U.S. Pat. No. 4,409,134.

In order to improve the crystallinity of the microcrystalline semiconductor film 107, the concentrations of oxygen and nitrogen contained in the microcrystalline semiconductor film which are measured by secondary ion mass spectrometry are preferably set to less than $1 \times 10^{18}$ atoms/$cm^3$.

As for the impurity semiconductor films 109, amorphous silicon to which phosphorus is added or microcrystalline silicon to which phosphorus is added is formed in the case of an n-channel thin film transistor. Alternatively, in the case of a p-channel thin film transistor, amorphous silicon to which boron is added or microcrystalline silicon to which boron is added is formed.

The wirings 111 can be formed in a single layer or a stacked layer of aluminum, copper, titanium, neodymium, scandium, molybdenum, chromium, tantalum, tungsten, and the like. An aluminum alloy to which an element to prevent a hillock is added (e.g., an aluminum-neodymium alloy which can be used for the gate electrode 103) may also be used. The wirings 111 may also have a stacked structure in which a film in contact with the impurity semiconductor films 109 is formed using titanium, tantalum, molybdenum, or tungsten, or a nitride of any of these elements, and aluminum or an aluminum alloy is formed thereover. Furthermore, a stacked structure may also be employed in which upper and lower surfaces of aluminum or an aluminum alloy may each be covered with titanium, tantalum, molybdenum, or tungsten, or a nitride of any of these elements.

Figure 6B:
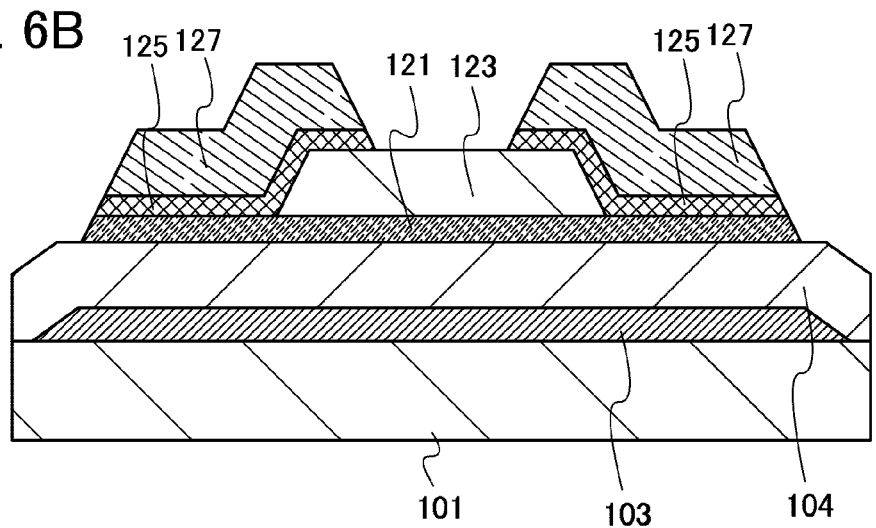

A thin film transistor shown in FIG. 6B is a channel stop thin film transistor. A gate electrode 103 is formed over a substrate 101, and a gate insulating film 104 is formed to cover the substrate 101 and the gate electrode 103. A microcrystalline semiconductor film 121 is formed over the gate insulating film 104. A channel protective film 123 is formed over the microcrystalline semiconductor film 121. A pair of impurity semiconductor films 125 are formed over the microcrystalline semiconductor film 121 and the channel protective film 123. Further, wirings 127 are formed in contact with the pair of impurity semiconductor films 125. The microcrystalline semiconductor film 121 is formed using the method for forming a microcrystalline semiconductor film described in Embodiment 1, whereby a channel formation region can be formed using a microcrystalline semiconductor film with high crystallinity to increase the on-current and the field effect mobility of the thin film transistor. In addition, since crystal grains of the microcrystalline semiconductor film are adjacent to each other at a large contact area, carriers can move easily in the channel formation region to increase the on-current and the field effect mobility of the thin film transistor.

The channel protective film 123 can be formed in a manner similar to that of the gate insulating film 104. Alternatively, an organic insulating film of polyimide, an epoxy resin, an acrylic resin, or the like can be used.

The pair of impurity semiconductor films 125 can be formed using a material and a structure similar to those of the pair of impurity semiconductor films 109 shown in FIG. 6A.

The wirings 127 can be formed using a material and a structure similar to those of the pair of wirings 111 shown in FIG. 6A.

In the channel protective thin film transistor, the channel formation region is formed using the microcrystalline semiconductor film described in Embodiment 1 and the channel protective film is provided; therefore, the on-current and the field effect mobility can be increased and the off-current can be reduced.

Figure 6C:
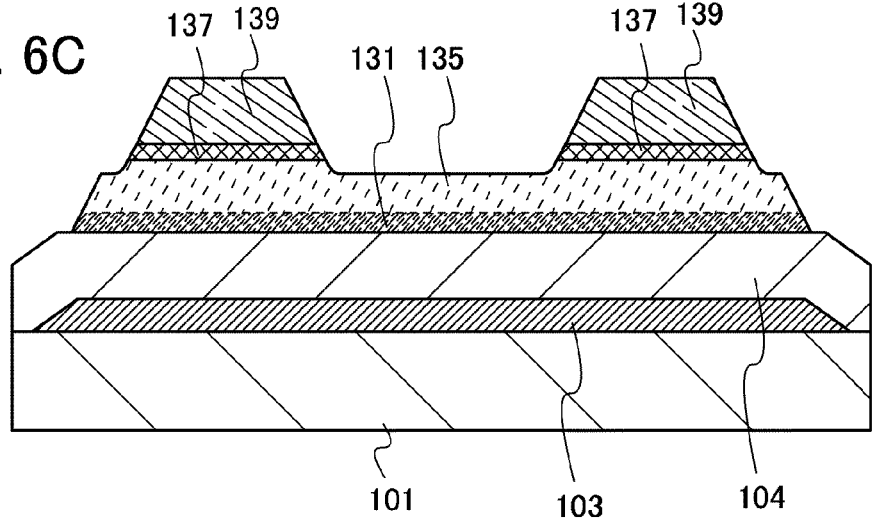

A thin film transistor shown in FIG. 6C is a channel-etched thin film transistor, which is different from those in FIG. 6A and FIG. 6B in that an amorphous semiconductor film is provided between a microcrystalline semiconductor film 131 and a pair of impurity semiconductor films 137.

A gate electrode 103 is formed over a substrate 101, and a gate insulating film 104 is formed to cover the substrate 101 and the gate electrode 103. The microcrystalline semiconductor film 131 is formed over the gate insulating film 104. An amorphous semiconductor film 135 is formed over the microcrystalline semiconductor film 131. The pair of impurity films 137 are formed over the amorphous semiconductor film 135. Further, wirings 139 are formed in contact with the pair of impurity semiconductor films 137. The microcrystalline semiconductor film 131 is formed using the method for forming a microcrystalline semiconductor film described in Embodiment 1, whereby a channel formation region can be formed using a microcrystalline semiconductor film with high crystallinity to increase the on-current and the field effect mobility of the thin film transistor. In addition, since crystal grains of the microcrystalline semiconductor film are adjacent to each other at a large contact area, carriers can move easily in the channel formation region to increase the on-current and the field effect mobility of the thin film transistor.

The amorphous semiconductor film 135 can be formed with amorphous silicon, amorphous silicon containing nitrogen, amorphous silicon containing chlorine, or the like. The off-current of the thin film transistor can be reduced by providing the amorphous semiconductor film 135 between the microcrystalline semiconductor film 131 and the pair of impurity semiconductor films 137.

As the amorphous semiconductor film 135, a semiconductor film of which a peak region of a spectrum obtained by performing low-temperature photoluminescence spectroscopy is 1.31 to 1.39 eV inclusive can be used. As for the semiconductor film, a semiconductor film of which the energy of an Urbach edge measured by a constant photocurrent method (CPM) or photoluminescence spectroscopy and the amount of defect absorption spectrum are small can be formed. That is, compared to a conventional amorphous semiconductor, the semiconductor here is a well-ordered semiconductor which has fewer defects and whose tail of a level at a band edge in the valence band is steep. Since the semiconductor film has a steep tail of a level at a band edge in the valence band, the band gap gets wider and tunneling current does not easily flow. Therefore, the off-current of the thin film transistor can be reduced while the on-current and the field effect mobility are increased by providing such a semiconductor film on a back channel side.

The pair of impurity semiconductor films 137 can be formed using a material and a structure similar to those of the pair of impurity semiconductor films 109 shown in FIG. 6A.

The wirings 139 can be formed using a material and a structure similar to those of the pair of wirings 111 shown in FIG. 6A.

In the thin film transistor shown in FIG. 6C, the channel formation region is formed using the microcrystalline semiconductor film described in Embodiment 1 and the amorphous semiconductor film 135 is provided; therefore, the on-current and the field effect mobility can be increased and the off-current can be reduced.

(Embodiment 3)

In this embodiment, a method for manufacturing the thin film transistor shown in FIG. 6C, which is one embodiment of the thin film transistors described in Embodiment 2, will be described with reference to FIGS. 7A to 7D, FIGS. 8A to 8C, FIGS. 9A and 9B, FIG. 10, and FIGS. 11A and 11B.

Here, all thin film transistors formed over one substrate preferably have the same conductivity type because the number of manufacturing steps can be reduced. In view of the above, a method for manufacturing an n-channel thin film transistor will be described in this embodiment.

Figure 7A:
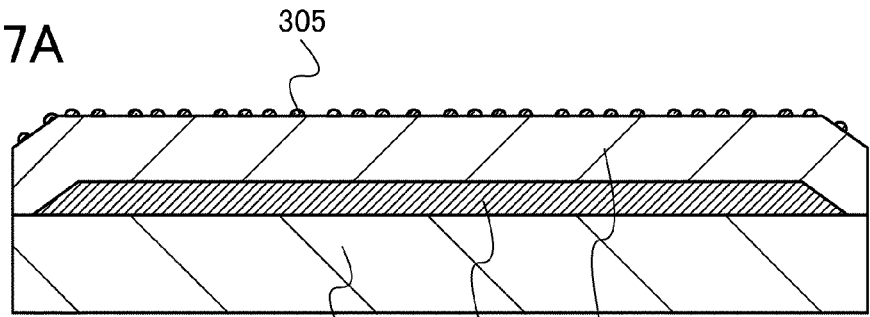
FIGS. 7A to 7D are views illustrating one mode of a method for manufacturing the thin film transistor.

As shown in FIG. 7A, a gate electrode 303 is formed over a substrate 301. Then, after a gate insulating film 304 is formed so as to cover the gate electrode 303, crystal particles 305 are formed over the gate insulating film 304 by the method for forming crystal particles described in Embodiment 1.

As the substrate 301, the substrate 101 described in Embodiment 2 can be used as appropriate.

The material and the structure of the gate electrode 103 described in Embodiment 2 can be employed as appropriate for the gate electrode 303.

The gate electrode 303 can be formed as follows: a conductive film is formed over the substrate 301 by a sputtering method or a vacuum evaporation method, a mask is formed over the conductive film by a photolithography method, an ink-jet method, or the like, and then the conductive film is etched using the mask. Further, the gate electrode 303 can also be formed by discharging a conductive nanopaste of silver, gold, copper, or the like to the substrate by an ink-jet method and baking the conductive nanopaste. In this embodiment, a conductive film is formed over the substrate 301 and then etched using a resist mask which is formed through a first photolithography process, so that the gate electrode 303 is formed.

Note that, in a photolithography process, a resist may be formed over the entire surface of the substrate. Alternatively, a resist may be printed by a printing method on a region where a resist mask is to be formed, and then, the resist may be exposed to light, so that the resist can be saved and a cost reduction can be achieved. In addition, instead of exposing a resist to light by using a light-exposure machine, a laser beam direct drawing apparatus may be used to expose the resist to light.

In addition, when the side surfaces of the gate electrode 303 have a tapered shape, disconnection of a semiconductor film and a wiring film which are formed over the gate electrode 303 at a step portion can be reduced. In order to form the side surfaces of the gate electrode 303 into a tapered shape, etching may be performed while a resist mask is being reduced in size.

In addition, through the step of forming the gate electrode 303, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, one embodiment of the present invention is not limited thereto, and the gate electrode 303 and one of or both the gate wiring and the capacitor wiring may be formed in separate steps.

The material and the structure of the gate insulating film 104 described in Embodiment 2 can be employed as appropriate for the gate insulating film 304. The gate insulating film 304 can be formed by a sputtering method, a CVD method, a coating method, a printing method, or the like as appropriate.

Further, by forming a silicon oxide film by a CVD method using an organosilane gas as the uppermost surface of the gate insulating film 304, the crystallinity of a first semiconductor film which is formed later can be improved, so that the on-current and the field effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The crystal particles 305 are formed by the method for forming the crystal particles 44 described in Embodiment 1. A deposition gas containing silicon or germanium is introduced into the treatment chamber from the gas supply port 87 of the first electrode 81 or 92 of the plasma CVD apparatus shown in FIG. 3 or FIG. 4, and a high-frequency power source is turned on to supply high-frequency power, whereby the crystal particles 305 are formed. In addition to the deposition gas containing silicon or germanium, hydrogen may be introduced into the treatment chamber from the gas supply port 87. Furthermore, hydrogen and a rare gas may be introduced, in addition to the deposition gas containing silicon or germanium.

Figure 7B:
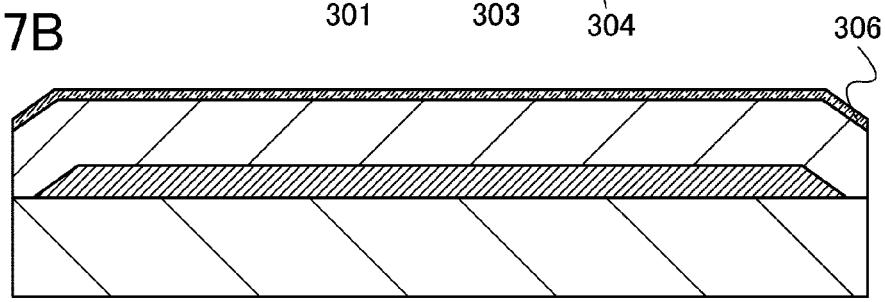

Then, as shown in FIG. 7B, crystals are grown using the crystal particles 305 as crystal nuclei, so that a first semiconductor film 306 is formed.

The first semiconductor film 306 is formed by the method for forming the microcrystalline semiconductor film 46 described in Embodiment 1.

The thickness of the first semiconductor film 306 is preferably 3 nm to 100 nm, more preferably 5 nm to 50 nm. This is because when the first semiconductor film 306 is too thin, the on-current of the thin film transistor is reduced. Further, when the first semiconductor film 306 is too thick, the off-current of the thin film transistor is increased while the thin film transistor operates at a high temperature. When the thickness of the first semiconductor film 306 is set to 3 nm to 100 nm, preferably 5 nm to 50 nm, the on-current and the off-current of the thin film transistor can be controlled.

In this embodiment, the first semiconductor film 306 is formed with glow discharge plasma using the deposition gas containing silicon or germanium and hydrogen which are introduced into the treatment chamber from the gas supply port 86 of the first electrode 81 or 92 of the plasma CVD apparatus shown in FIG. 3 or FIG. 4. Alternatively, the first semiconductor film 306 is formed with glow discharge plasma using the deposition gas containing silicon or germanium, hydrogen, and a rare gas such as helium, neon, argon, krypton, or xenon which are introduced into the treatment chamber from the gas supply port 86 of the first electrode 81 or 92 of the plasma CVD apparatus shown in FIG. 3 or FIG. 4. Microcrystalline silicon, microcrystalline silicon germanium, microcrystalline germanium, or the like is formed using a mixed gas which is obtained by diluting the deposition gas containing silicon or germanium with hydrogen whose flow rate is 10 to 2000 times, preferably 10 to 200 times that of the deposition gas. The deposition temperature in that case is preferably a room temperature to 300° C., more preferably, 200° C. to 280° C.

Typical examples of the deposition gas containing silicon or germanium include silane ($SiH_4$), disilane ($Si_2H_6$), germane ($GeH_4$), and digermane ($Ge_2H_6$).

In addition, before the first semiconductor film 306 is formed, impurities in the treatment chamber of the CVD apparatus are removed by introducing the deposition gas containing silicon or germanium while exhausting the air in the treatment chamber, so that the amount of the impurities at the interface between the gate insulating film 304 and the first semiconductor film 306 of the thin film transistor to be formed can be reduced, and thus, the electric characteristics of the thin film transistor can be improved.

Alternatively, before forming the first semiconductor film 306, the surface of the gate insulating film 304 may be exposed to oxygen plasma, hydrogen plasma, or the like.

Figure 7C:
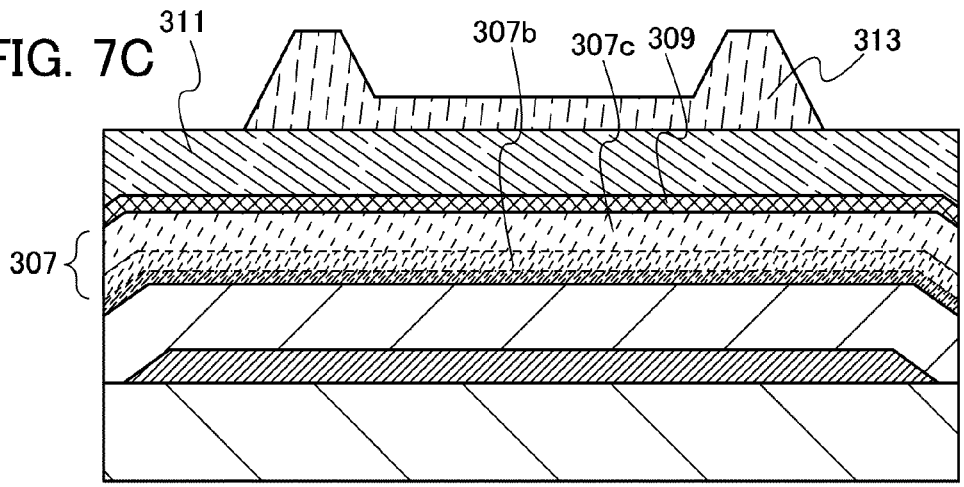

Next, as shown in FIG. 7C, a second semiconductor film 307 is formed over the first semiconductor film 306. Here, a structure including a mixed region 307b and a region 307c containing an amorphous semiconductor is used as the second semiconductor film 307. Then, an impurity semiconductor film 309 and a conductive film 311 are formed over the second semiconductor film 307. After that, a resist mask 313 is formed over the conductive film 311.

The second semiconductor film 307 including the mixed region 307b and the region 307c containing an amorphous semiconductor can be formed under a condition that a crystal grows partly by using the first semiconductor film 306 as a seed crystal.

The second semiconductor film 307 is formed with glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine and the like. Glow discharge plasma can be generated as in the case of the first semiconductor film 306.

Silane and hydrogen are introduced into the reaction chamber from the gas supply port 86, and ammonia diluted with hydrogen is introduced into the reaction chamber from the gas supply port 87; in this manner, ammonia which is not easily dissociated can be introduced into the reaction chamber from a tip of the projecting electrode 84. Accordingly, ammonia can be easily dissociated, whereby reaction with silane which is introduced into the reaction chamber from the gas supply port 86 proceeds, and the deposition rate can be increased.

In this case, with the use of the deposition gas containing silicon or germanium and a gas containing nitrogen as a source gas, crystal growth can be reduced, compared to the deposition condition of the first semiconductor film 306. As a result, the mixed region 307b and the region 307c containing an amorphous semiconductor, which is formed with a well-ordered semiconductor film having fewer defects and a steep tail of a level at a band edge in the valence band, can be formed in the second semiconductor film 307.

Here, a typical example of a condition for forming the second semiconductor film 307 is as follows: the flow rate of hydrogen is 10 to 2000 times, preferably, 10 to 200 times that of the deposition gas containing silicon or germanium. Note that in a typical example of a condition for forming a normal amorphous semiconductor film, the flow rate of hydrogen is 0 to 5 times that of the deposition gas containing silicon or germanium.

A rare gas such as helium, neon, argon, xenon, or krypton is introduced to the source gas of the second semiconductor film 307, whereby the deposition rate of the second semiconductor film 307 can be increased.

The thickness of the second semiconductor film 307 is preferably 50 nm to 350 nm, more preferably 120 nm to 250 nm.

At an early stage of deposition of the second semiconductor film 307, since a gas containing nitrogen is contained in the source gas, the crystal growth is partly suppressed; therefore, while conical or pyramidal microcrystalline semiconductor regions grow, an amorphous semiconductor region filling a space between the conical or pyramidal microcrystalline semiconductor regions is formed. Such a region where both the microcrystalline semiconductor region and the amorphous semiconductor region exist is referred to as the mixed region 307b. Further, crystal growth of the conical or pyramidal microcrystalline semiconductor region is stopped and thus a microcrystalline semiconductor region is not formed but only an amorphous semiconductor region is formed. Such a region where a microcrystalline semiconductor region is not formed but only an amorphous semiconductor region is formed is referred to as the region 307c containing an amorphous semiconductor. Before the conical or pyramidal microcrystalline semiconductor region grows, a microcrystalline semiconductor film is deposited over an entire surface of the first semiconductor film 306 using the first semiconductor film 306 as a seed crystal in some cases.

Here, a gas containing nitrogen is contained in the source gas of the second semiconductor film 307, and the second semiconductor film 307 including the mixed region 307b and the region 307c containing an amorphous semiconductor is formed. In another method for forming the second semiconductor film 307, the surface of the first semiconductor film 306 is exposed to a gas containing nitrogen so that nitrogen is adsorbed onto the surface of the first semiconductor film 306, and then, the second semiconductor film 307 including the mixed region 307b and the region 307c containing an amorphous semiconductor is formed by using the deposition gas containing silicon or germanium and hydrogen for the source gas.

The impurity semiconductor film 309 is formed with glow discharge plasma using a mixture of a deposition gas containing silicon, hydrogen, and phosphine (diluted with hydrogen or silane) in a treatment chamber of the plasma CVD apparatus. Amorphous silicon to which phosphorus is added or microcrystalline silicon to which phosphorus is added is formed with a mixture obtained by diluting the deposition gas containing silicon with hydrogen. In the case of manufacturing a p-channel thin film transistor, the impurity semiconductor film 309 may be formed using amorphous silicon to which boron is added or microcrystalline silicon to which boron is added, with glow discharge plasma using diborane instead of phosphine.

Now, the structure of the second semiconductor film 307 which is formed between the gate insulating film 304 and the impurity semiconductor film 309 will be described with reference to FIGS. 9A and 9B, FIG. 10, and FIGS. 11A and 11B, which are enlarged views each showing the structure between the gate insulating film 304 and the impurity semiconductor film 309.

Figure 9A:
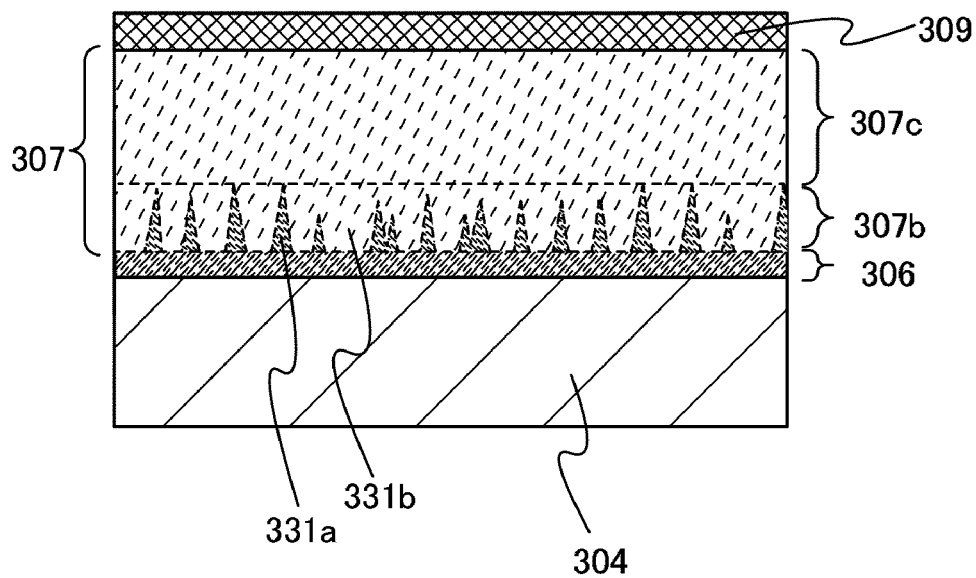
FIGS. 9A and 9B are views illustrating one mode of the method for manufacturing the thin film transistor.

As shown in FIG. 9A, the mixed region 307b includes a microcrystalline semiconductor region 331a which grows into a projecting shape from the surface of the first semiconductor film 306 and an amorphous semiconductor region 331b which fills a space between the microcrystalline semiconductor regions 331a.

The microcrystalline semiconductor region 331a is a microcrystalline semiconductor having a projecting (conical or pyramidal) shape whose end is narrowed from the first semiconductor film 306 toward the region 307c containing an amorphous semiconductor. Note that the microcrystalline semiconductor region 331a may be a microcrystalline semiconductor which has a projecting (inverted conical or inverted pyramidal) shape having a width which is increased from the first semiconductor film 306 toward the region 307c containing an amorphous semiconductor.

In addition, the amorphous semiconductor region 331b included in the mixed region 307b may include a semiconductor crystal grain having a size of 1 nm to 10 nm inclusive, preferably 1 nm to 5 nm inclusive.

Figure 9B:
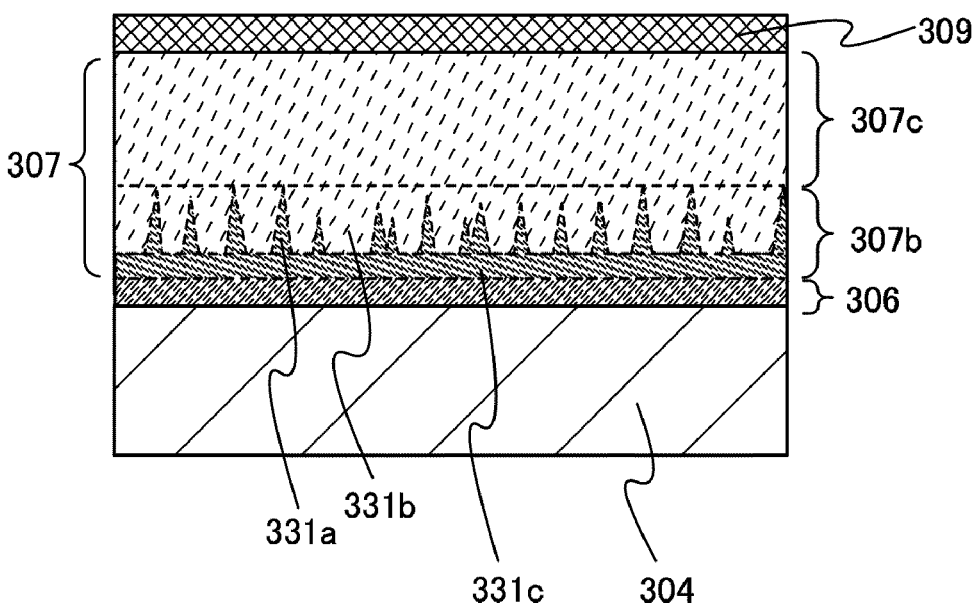

Alternatively, as shown in FIG. 9B, the mixed region 307b includes a microcrystalline semiconductor region 331c and the microcrystalline semiconductor region 331a which are successively formed, in some cases. The microcrystalline semiconductor region 331c is deposited with a uniform thickness over the first semiconductor film 306. The microcrystalline semiconductor region 331a has a projecting (conical or pyramidal) shape whose end is narrowed from the first semiconductor film 306 toward the region 307c containing an amorphous semiconductor.

In addition, in FIGS. 9A and 9B, the amorphous semiconductor region 331b included in the mixed region 307b is a semiconductor, the quality of which is substantially the same as the quality of the region 307c containing an amorphous semiconductor.

According to the above, the interface between a region formed using a microcrystalline semiconductor and a region formed using an amorphous semiconductor may correspond to the interface between the microcrystalline semiconductor region 331a and the amorphous semiconductor region 331b in the mixed region 307b. Therefore, the interface between the microcrystalline semiconductor and the amorphous semiconductor can be described as uneven or zigzag in a cross-sectional view.

In addition, in the mixed region 307b, in the case where the microcrystalline semiconductor region 331a is a semiconductor crystal grain having a projecting (conical or pyramidal) shape whose end is narrowed from the first semiconductor film 306 toward the region 307c containing an amorphous semiconductor, the proportion of the microcrystalline semiconductor in the vicinity of the first semiconductor film 306 is higher than that in the vicinity of the region 307c containing an amorphous semiconductor. The microcrystalline semiconductor region 331a grows in a thickness direction from the surface of the first semiconductor film 306. However, by adding a gas containing nitrogen to the source gas or by adding a gas containing nitrogen to the source gas and reducing the flow rate of hydrogen to silane from that under the condition for forming the first semiconductor film 306, crystal growth of the microcrystalline semiconductor region 331a is suppressed and the semiconductor crystal grain becomes a conical or pyramidal shape, and then, the amorphous semiconductor is gradually deposited. This is because the solid solubility of nitrogen in the microcrystalline semiconductor region is lower than the solid solubility of nitrogen in the amorphous semiconductor region.

The total thickness of the first semiconductor film 306 and the mixed region 307b, that is, the distance from the interface between the gate insulating film 304 and the first semiconductor film 306 to the end of the projection (projecting portion) of the microcrystalline semiconductor region 331a, is set to be in the range of 3 nm to 410 nm inclusive, preferably 20 nm to 100 nm inclusive. When the total thickness of the first semiconductor film 306 and the mixed region 307b is set to be in the range of 3 nm to 410 nm inclusive, preferably 20 nm to 100 nm inclusive, the off-current of the thin film transistor can be reduced.

As described above, the region 307c containing an amorphous semiconductor is a semiconductor, the quality of which is substantially the same as the quality of the amorphous semiconductor region 331b, and contains nitrogen. Further, the region 307c containing an amorphous semiconductor may include a semiconductor crystal grain having a size of 1 nm to 10 nm inclusive, preferably 1 nm to 5 nm inclusive. Here, the region 307c containing an amorphous semiconductor is a semiconductor film having a smaller amount of the defect absorption spectrum and lower energy at an Urbach edge, measured by a constant photocurrent method (CPM) or photoluminescence spectroscopy, compared to the conventional amorphous semiconductor. That is, compared to the conventional amorphous semiconductor, the region 307c containing an amorphous semiconductor is a well-ordered semiconductor which has fewer defects and a steep tail of a level at a band edge in the valence band. Since the region 307c containing an amorphous semiconductor has a steep tail of a level at a band edge in the valence band, the band gap gets wider and tunneling current does not easily flow. Therefore, by providing the region 307c containing an amorphous semiconductor on the back channel side, the off-current of the thin film transistor can be reduced. In addition, by providing the region 307c containing an amorphous semiconductor, the on-current and the field effect mobility can be increased.

Further, a peak region of a spectrum obtained by performing low-temperature photoluminescence spectroscopy on the region 307c containing an amorphous semiconductor is 1.31 eV to 1.39 eV inclusive. Note that a peak region of a spectrum obtained by performing low-temperature photoluminescence spectroscopy on a microcrystalline semiconductor film such as a microcrystalline silicon film is 0.98 eV to 1.02 eV inclusive. Accordingly, the region 307c containing an amorphous semiconductor is different from a microcrystalline semiconductor film.

Note that an amorphous semiconductor included in the region 307c containing an amorphous semiconductor is typically amorphous silicon.

Note that nitrogen contained in the mixed region 307b and the region 307c containing an amorphous semiconductor may exist as an NH group or an $NH_2$ group, for example.

Figure 10:
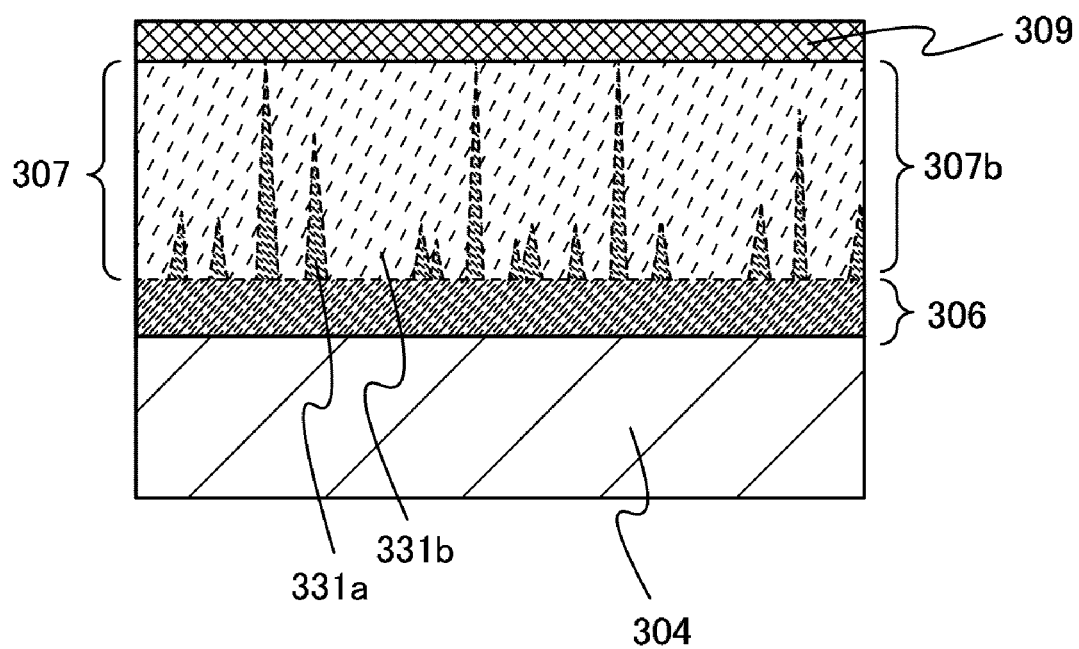
FIG. 10 is a view illustrating one mode of the method for manufacturing the thin film transistor.

Alternatively, as shown in FIG. 10, a region between the first semiconductor film 306 and the impurity semiconductor film 309 may be entirely the mixed region 307b. In other words, the second semiconductor film 307 may be the mixed region 307b. It is preferable that, in the structure shown in FIG. 10, the proportion of the microcrystalline semiconductor regions 331a in the mixed region 307b be lower than that of the structures shown in FIGS. 9A and 9B. Further, the proportion of the microcrystalline semiconductor regions 331a in the mixed region 307b is preferably low in a region between source and drain regions, that is, a region where carriers flow. Accordingly, the off-current of the thin film transistor can be reduced. In addition, in the mixed region 307b, it is possible to reduce the resistance in a vertical direction (a thickness direction), that is, the resistance between the first and second semiconductor films 306 and 307 and the source and drain regions, when the thin film transistor is in an on-state and voltage is applied to the source and drain electrodes formed using wirings 325, and thus, the on-current and the field effect mobility of the thin film transistor can be increased.

Note that the mixed region 307b shown in FIG. 10 may include the microcrystalline semiconductor region 331c as shown in FIG. 9B.

Figure 11A:
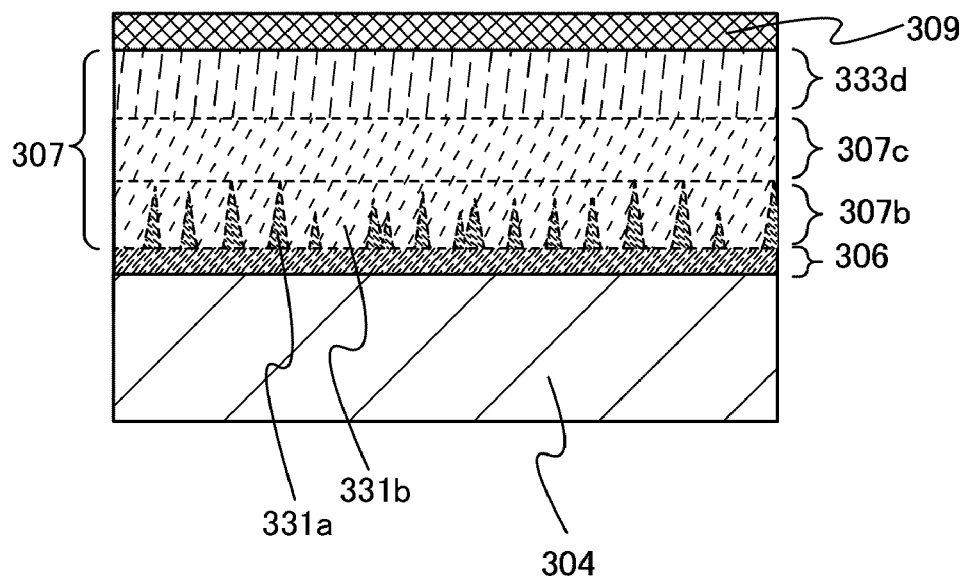
FIGS. 11A and 11B are views illustrating one mode of the method for manufacturing the thin film transistor.
Figure 11B:
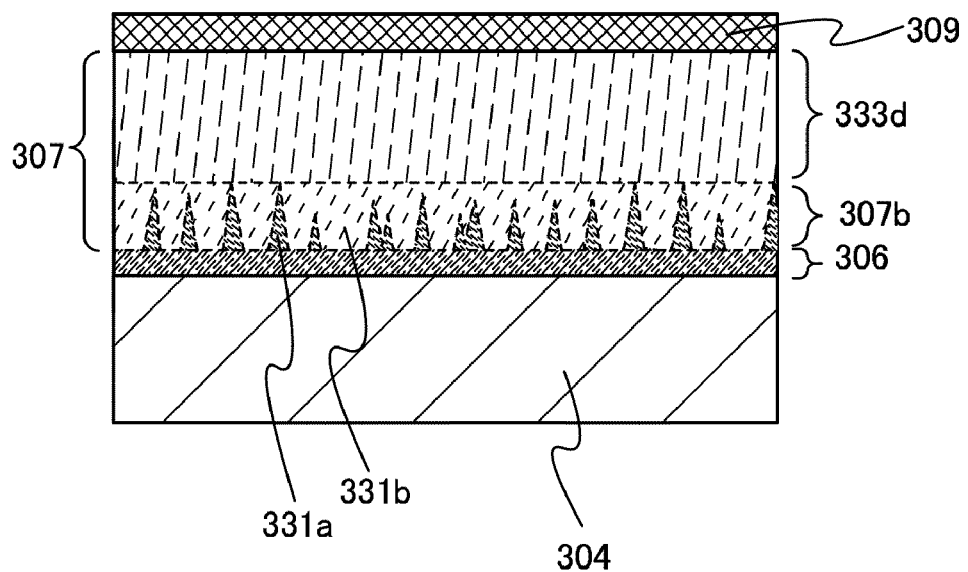

Further, a conventional amorphous semiconductor region 333d may be provided between the region 307c containing an amorphous semiconductor and the impurity semiconductor film 309 as shown in FIG. 11A. In other words, the second semiconductor film 307 may include the mixed region 307b, the region 307c containing an amorphous semiconductor, and the amorphous semiconductor region 333d. Alternatively, the conventional amorphous semiconductor region 333d may be provided between the mixed region 307b and the impurity semiconductor film 309 as shown in FIG. 11B. In other words, the second semiconductor film 307 may include the mixed region 307b and the amorphous semiconductor region 333d. The structures shown in FIGS. 11A and 11B enable the off-current of the thin film transistor to be reduced.

Note that the mixed regions 307b shown in FIGS. 11A and 11B may include the microcrystalline semiconductor region 331c as shown in FIG. 9B.

Since the mixed region 307b includes the microcrystalline semiconductor region 331a having a conical or pyramidal shape, it is possible to reduce the resistance in a vertical direction (a thickness direction), that is, the resistance of the first semiconductor film 306, the mixed region 307b, and the region 307c containing an amorphous semiconductor, when the thin film transistor is in an on-state and voltage is applied between the source and drain electrodes.

As described above, nitrogen contained in the mixed region 307b may exist typically as an NH group or an $NH_2$ group. This is because the number of defects is reduced when an NH group or an $NH_2$ group is bonded to dangling bonds of silicon atoms at the interface between a plurality of microcrystalline semiconductor regions included in the microcrystalline semiconductor region 331a, the interface between the microcrystalline semiconductor region 331a and the amorphous semiconductor region 331b, or the interface between the first semiconductor film 306 and the amorphous semiconductor region 331b. Accordingly, when the nitrogen concentration of the second semiconductor film 307 is set to $1\times10^{19}$ atoms/cm$^3$ to $1\times10^{21}$ atoms/cm$^3$ inclusive, preferably $1\times10^{20}$ atoms/cm$^3$ to $1\times10^{21}$ atoms/cm$^3$ inclusive, more preferably $2\times10^{20}$ atoms/cm$^3$ to $1\times10^{21}$ atoms/cm$^3$ inclusive, the dangling bonds of silicon atoms can be easily cross-linked with an NH group, so that carriers can flow easily. Alternatively, the dangling bonds of the semiconductor atoms at the aforementioned interfaces are terminated with an $NH_2$ group, so that the defect level disappears. As a result, the resistance in a vertical direction (a thickness direction) when the thin film transistor is in an on-state and voltage is applied between the source electrode and drain electrode is reduced. That is, the field effect mobility and the on-current of the thin film transistor are increased.

In addition, by making the oxygen concentration lower than the nitrogen concentration in the mixed region 307b, bonds which interrupt carrier transfer due to defects at the interface between the microcrystalline semiconductor region 331a and the amorphous semiconductor region 331b or at the interface between semiconductor crystal grains can be reduced.

In this manner, the off-current of the thin film transistor can be reduced when a channel formation region is formed using the first semiconductor film 306 and the region 307c containing an amorphous semiconductor is provided between the channel formation region and the impurity semiconductor film 309. In addition, the off-current of the thin film transistor can be further reduced while the on-current and the field effect mobility can be increased when the mixed region 307b and the region 307c containing an amorphous semiconductor are provided. This is because the mixed region 307b includes the microcrystalline semiconductor region 331a having a conical or pyramidal shape and the region 307c containing an amorphous semiconductor is formed using a well-ordered semiconductor film which has few defects and a steep tail of a level at a band edge in the valence band.

The material and the structure described in Embodiment 2 can be employed as appropriate for the conductive film 311.

The conductive film 311 is formed by a CVD method, a sputtering method, or a vacuum evaporation method. Alternatively, the conductive film 311 may be formed by discharging a conductive nanopaste of silver, gold, copper, or the like by a screen printing method, an ink-jet method, or the like and baking the conductive nanopaste.

The resist mask 313 is formed through a second photolithography process. The resist mask 313 has regions with different thicknesses. Such a resist mask can be formed using a multi-tone mask. The multi-tone mask is preferably used because the number of photomasks used and the number of manufacturing steps can be reduced. In this embodiment, a resist mask formed using a multi-tone mask can be used in a step of forming patterns of the first semiconductor film 306 and the second semiconductor film 307 and a step of forming a source region and a drain region.

The multi-tone mask is a mask with which exposure can be performed with the amount of light in a plurality of levels. Typically, exposure is performed with the amount of light in three levels: an exposure region, a half-exposure region, and a non-exposure region. By one light exposure and development step with the use of the multi-tone mask, a resist mask with plural thicknesses (typically, two kinds of thicknesses) can be formed. Therefore, by the usage of a multi-tone mask, the number of photomasks can be reduced.

Next, with the use of the resist mask 313, the first semiconductor film 306, the second semiconductor film 307, the impurity semiconductor film 309, and the conductive film 311 are etched. Through this step, the first semiconductor film 306, the second semiconductor film 307, the impurity semiconductor film 309, and the conductive film 311 are separated for each element, to form a third semiconductor film 315, an impurity semiconductor film 317, and a conductive film 319.

Figure 7D:
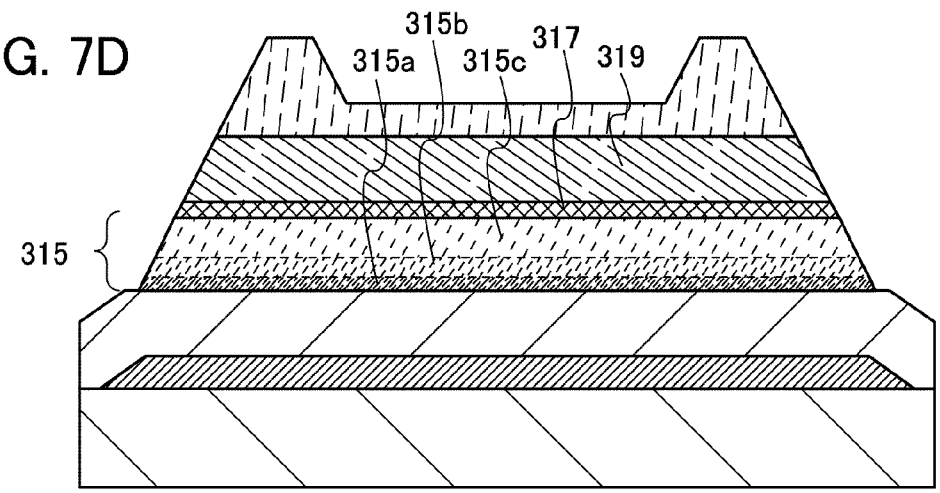

Note that the third semiconductor film 315 includes a microcrystalline semiconductor film 315a obtained by etching the first semiconductor film 306, a mixed region 315b obtained by etching the mixed region 307b of the second semiconductor film 307, and a region 315c containing an amorphous semiconductor, which is obtained by etching the region 307c containing an amorphous semiconductor of the second semiconductor film 307 (see FIG. 7D).

Next, the resist mask 313 is reduced in size to form a separated resist mask 323. Ashing using oxygen plasma may be performed in order that the resist mask is reduced in size. Here, ashing is performed on the resist mask 313 so that the resist mask 313 is separated over the gate electrode. Accordingly, the resist mask 323 can be formed (see FIG. 8A).

Figure 8A:
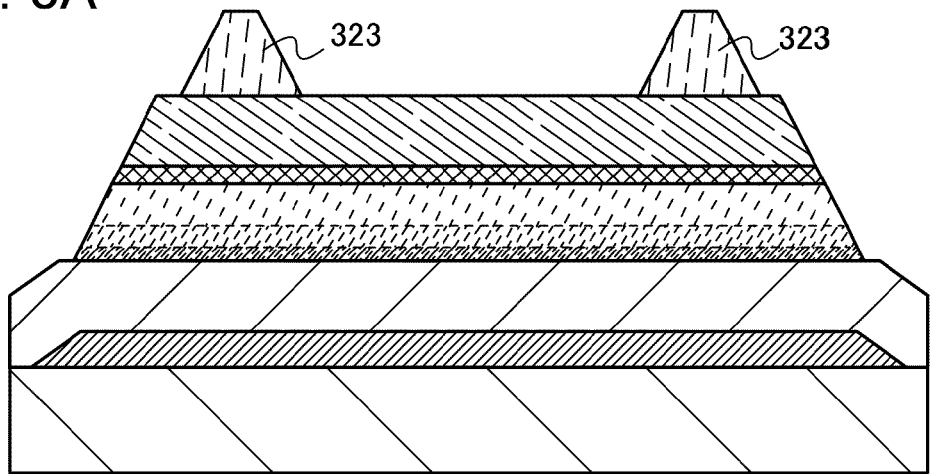
FIGS. 8A to 8C are views illustrating one mode of the method for manufacturing the thin film transistor.
Figure 8B:
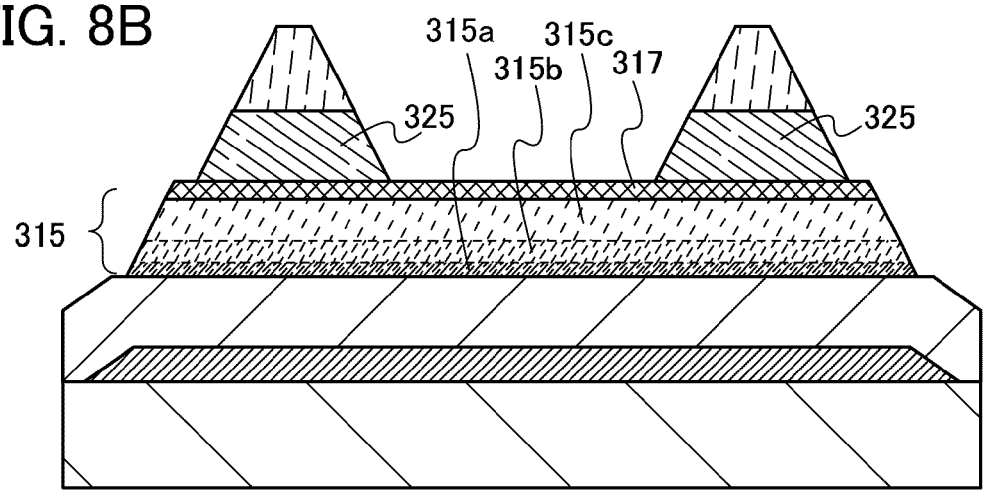
Figure 8C:
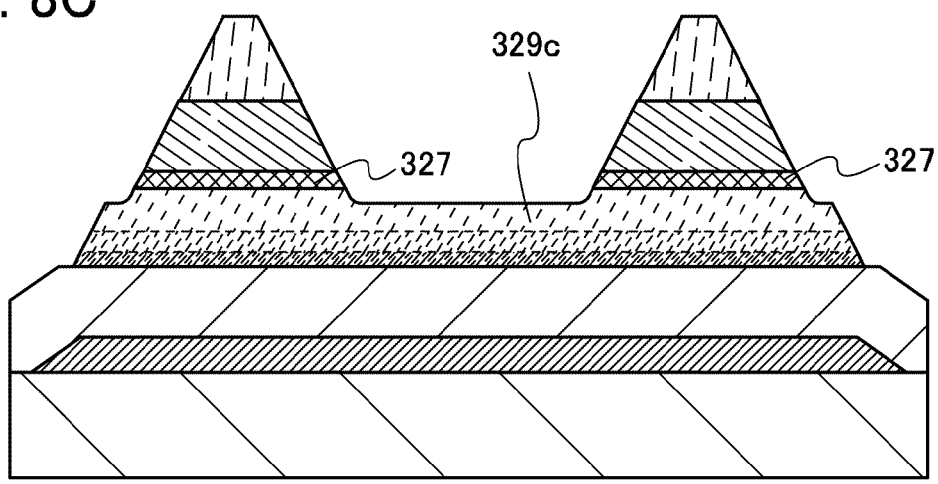

Next, the conductive film 319 is etched using the resist mask 323, whereby the wirings 325 serving as source and drain electrodes are formed (see FIG. 8B). Here, dry etching is employed. The wirings 325 serve not only as source and drain electrodes but also as a signal line. However, without limitation thereto, a signal line may be provided separately from the source and drain electrodes.

Next, with the use of the resist mask 323, the region 315c containing an amorphous semiconductor of the third semiconductor film 315 and the impurity semiconductor film 317 are each partly etched. Here, dry etching is employed. Through the above step, a region 329c containing an amorphous semiconductor which has a depression on its surface and impurity semiconductor films 327 serving as source and drain regions are formed (see FIG. 8C). After that, the resist mask 323 is removed.

Here, the conductive film 319, the region 315c containing an amorphous semiconductor, and the impurity semiconductor film 317 are each partly subjected to dry etching. Accordingly, the conductive film 319 is anisotropically etched, and thus, the side surfaces of the wirings 325 are substantially aligned with the side surfaces of the impurity semiconductor films 327.

Alternatively, the impurity semiconductor film 317 and the region 315c containing an amorphous semiconductor may be partly etched after etching of the conductive film 319 and removal of the resist mask 323. By the etching, the impurity semiconductor film 317 is etched using the wirings 325 as masks, so that the side surfaces of the wirings 325 are substantially aligned with the side surfaces of the impurity semiconductor films 327.

Note that the conductive film 319 may be subjected to wet etching, and the region 315c containing an amorphous semiconductor and the impurity semiconductor film 317 may be subjected to dry etching. With wet etching, the conductive film 319 is isotropically etched, so that the wirings 325 each of which is on the inner side than the resist mask 323 is formed. Then, a shape is formed in which the side surfaces of the impurity semiconductor film 327 are on the outer sides than the side surfaces of the wiring 325.

Next, dry etching may be performed. A condition of dry etching is set so that an exposed surface of the region 329c containing an amorphous semiconductor is not damaged and the etching rate with respect to the region 329c containing an amorphous semiconductor is low. In other words, a condition which gives almost no damages to the exposed surface of the region 329c containing an amorphous semiconductor and hardly reduces the thickness of the exposed portion of the region 329c containing an amorphous semiconductor is applied. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, the surface of the region 329c containing an amorphous semiconductor may be subjected to plasma treatment typified by water plasma treatment, ammonia plasma treatment, nitrogen plasma treatment, or the like.

The water plasma treatment can be performed by generating plasma using a gas containing water as its main component typified by water vapor, introduced into a reaction space.

As described above, after formation of the impurity semiconductor films 327, dry etching is further performed under such a condition that the region 329c containing an amorphous semiconductor is not damaged, whereby an impurity such as a residue existing on the exposed surface of the region 329c containing an amorphous semiconductor can be removed. By the plasma treatment, insulation between the source region and the drain region can be ensured, and thus, in a thin film transistor which is completed, the off-current can be reduced, and variation in electric characteristics can be reduced.

Through these steps, a thin film transistor with favorable electric characteristics can be manufactured with high productivity using a small number of masks.

(Embodiment 4)

In this embodiment, an element substrate and a display device including the element substrate to which any of the thin film transistors described in Embodiments 1 to 3 can be applied will be described below. As examples of the display device, a liquid crystal display device, a light-emitting display device, an electronic paper, and the like are given. The thin film transistor described in any of the above embodiments can be used for an element substrate of any other display device. Here, a liquid crystal display device including the thin film transistor described in Embodiment 3, typically, a vertical alignment (VA) liquid crystal display device will be described with reference to FIG. 12 and FIG. 13.

Figure 12:
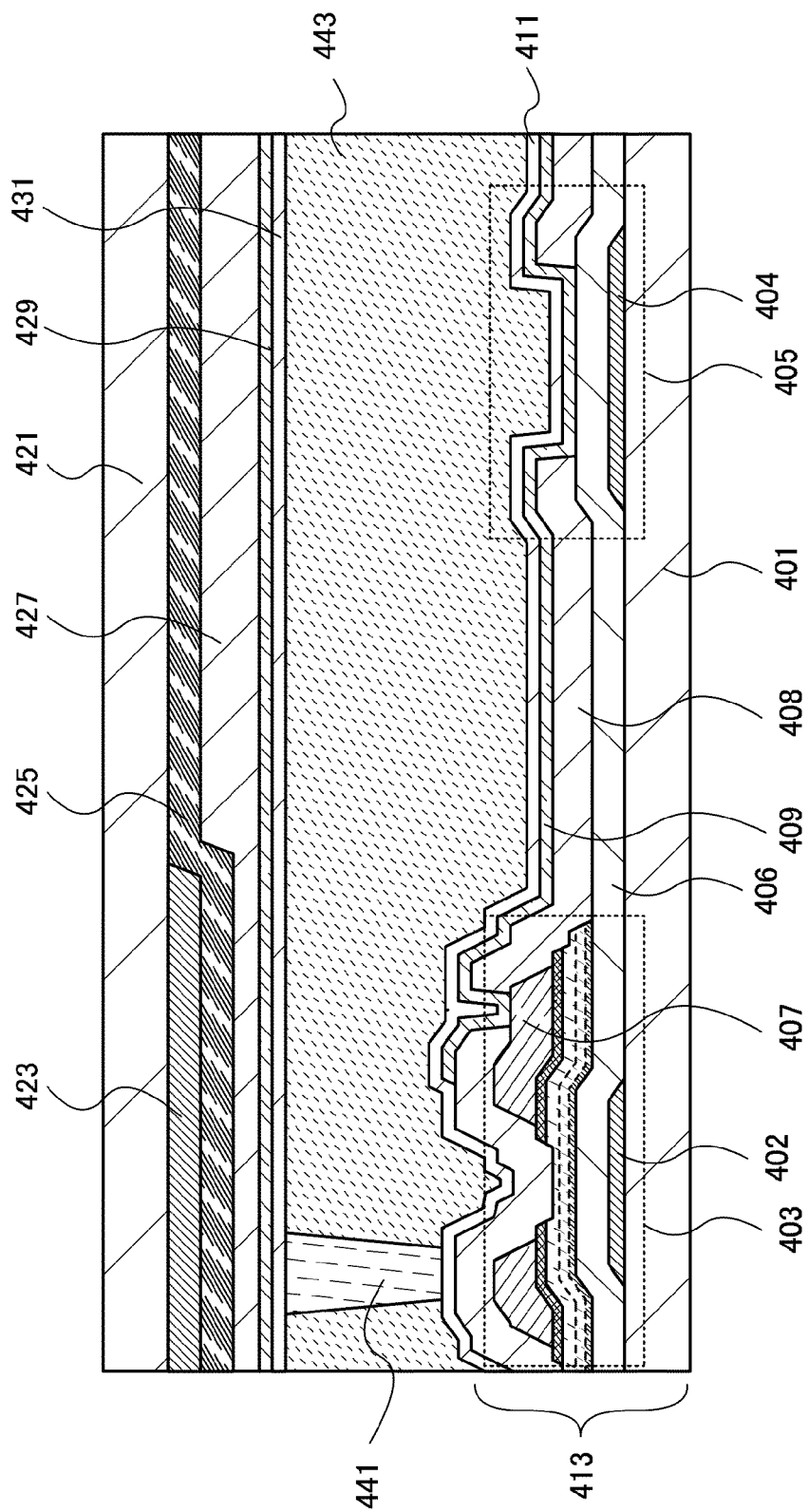
FIG. 12 is a cross-sectional view illustrating a display device.

FIG. 12 shows a cross-sectional structure of a pixel portion of a liquid crystal display device. A thin film transistor 403 manufactured by any of the above embodiments and a capacitor 405 are formed over a substrate 401. Further, a pixel electrode 409 is formed over an insulating film 408 which is formed over the thin film transistor 403. A source or drain electrode 407 of the thin film transistor 403 and the pixel electrode 409 are connected to each other in an opening formed in the insulating film 408. An alignment film 411 is formed over the pixel electrode 409.

The capacitor 405 includes a capacitor wiring 404 formed at the same time as a gate electrode 402 of the thin film transistor 403, a gate insulating film 406, and the pixel electrode 409.

A stack body including components from the substrate 401 to the alignment film 411 is referred to as an element substrate 413.

A counter substrate 421 is provided with a coloring film 425 and a light-blocking film 423 for blocking incidence of light to the thin film transistor 403. In addition, a planarization film 427 is formed on the light-blocking film 423 and the coloring film 425. A counter electrode 429 is formed on the planarization film 427, and an alignment film 431 is formed on the counter electrode 429.

Note that the light-blocking film 423, the coloring film 425, and the planarization film 427 on the counter substrate 421 function as a color filter. Note that either the light-blocking film 423 or the planarization film 427, or both of them are not necessarily formed on the counter substrate 421.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for a color filter. However, the combination of the coloring films is not limited to the above combination.

The substrate 401 and the counter substrate 421 are fixed to each other by a sealing material (not shown), and a liquid crystal layer 443 fills a space surrounded by the substrate 401, the counter substrate 421, and the sealing material. Further, a spacer 441 is provided to keep a distance between the substrate 401 and the counter substrate 421.

The pixel electrode 409, the liquid crystal layer 443, and the counter electrode 429 overlap with each other, whereby a liquid crystal element is formed.

Figure 13:
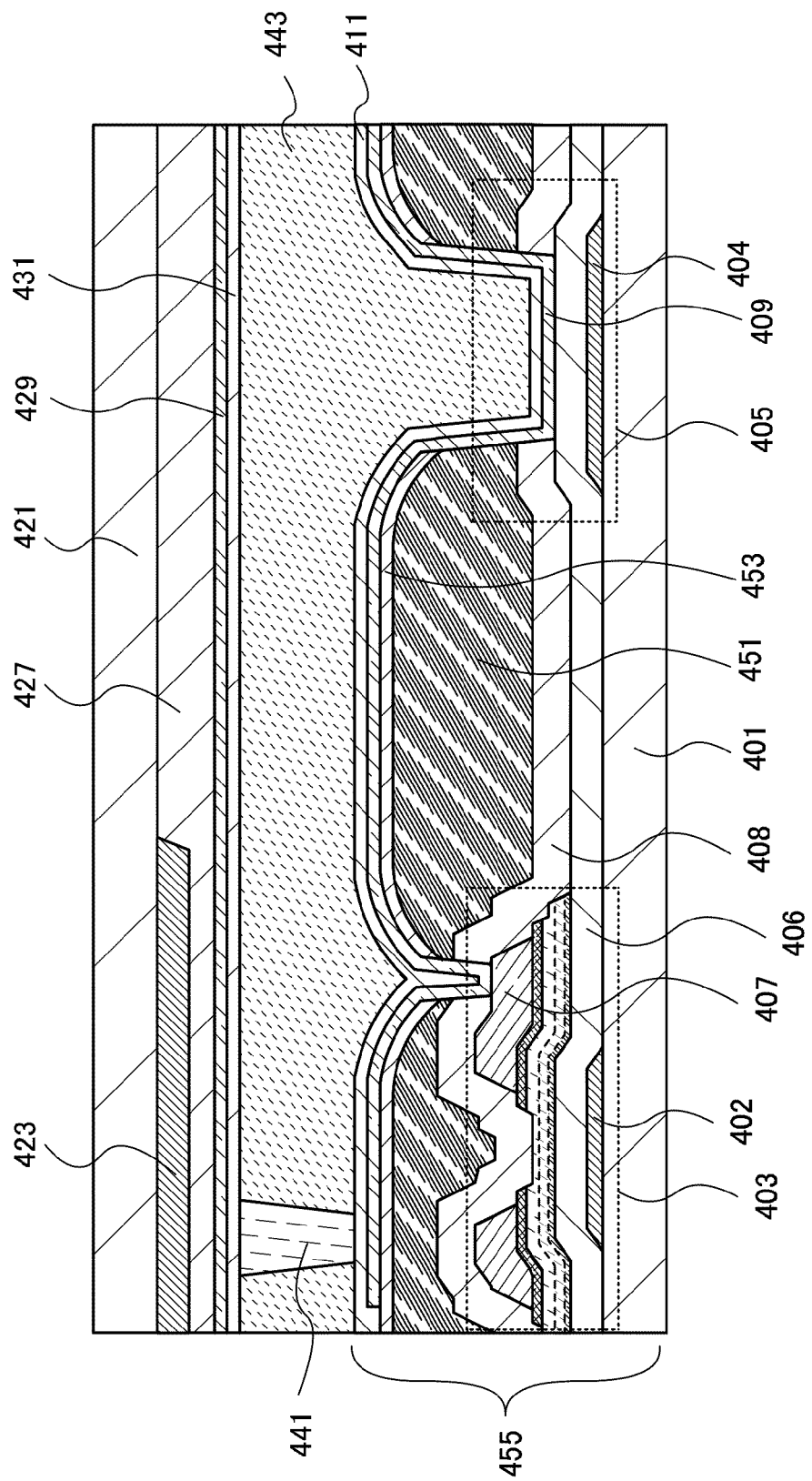
FIG. 13 is a cross-sectional view illustrating a display device.

FIG. 13 shows a liquid crystal display device different from that in FIG. 12. Here, a coloring film is formed not on the counter substrate 421 side but on the substrate 401 side, provided with the thin film transistor 403.

FIG. 13 shows a cross-sectional structure of a pixel portion of a liquid crystal display device. A thin film transistor 403 manufactured by any of the above embodiments and a capacitor 405 are formed over a substrate 401.

Further, a coloring film 451 is formed over an insulating film 408 which is formed over the thin film transistor 403. Furthermore, a protective film 453 is formed over the coloring film 451 in order to prevent an impurity contained in the coloring film 451 from being mixed into a liquid crystal layer 443. A pixel electrode 409 is formed over the coloring film 451 and the protective film 453. As the coloring film 451, a film which preferentially transmits light of a predetermined wavelength range (red light, blue light, or green light) may be formed for each pixel. Further, since the coloring film 451 also functions as a planarization film, uneven alignment of the liquid crystal layer 443 can be reduced.

A source or drain electrode 407 of the thin film transistor 403 and the pixel electrode 409 are connected to each other in an opening formed in the insulating film 408, the coloring film 451, and the protective film 453. An alignment film 411 is formed over the pixel electrode 409.

The capacitor 405 includes a capacitor wiring 404 formed at the same time as a gate electrode 402 of the thin film transistor 403, a gate insulating film 406, and the pixel electrode 409.

A stack body including components from the substrate 401 to the alignment film 411 is referred to as an element substrate 455.

A counter substrate 421 is provided with a light-blocking film 423 for blocking incidence of light to the thin film transistor 403, and a planarization film 427 covering the light-blocking film 423 and the counter substrate 421. A counter electrode 429 is formed on the planarization film 427, and an alignment film 431 is formed on the counter electrode 429.

The pixel electrode 409, the liquid crystal layer 443, and the counter electrode 429 overlap with each other, whereby a liquid crystal element is formed.

Note that although the VA liquid crystal display device is described here as a liquid crystal display device, the present invention is not limited thereto. In other words, the element substrate which is formed using the thin film transistor described in Embodiment 1 can be used for an FFS liquid crystal display device, an IPS liquid crystal display device, a TN liquid crystal display device, or another liquid crystal display device.

Since the thin film transistor with a large on-current, a high field effect mobility, and a small off-current is used as a pixel transistor in the liquid crystal display device of this embodiment, image quality of the liquid crystal display device can be improved (for example, a high contrast can be achieved). Further, electric characteristics of the thin film transistor are not degraded even when the thin film transistor is downsized; therefore, by reducing the area of the thin film transistor, the aperture ratio of the liquid crystal display device can be increased. In addition, the area of a pixel can be reduced, so that the resolution of the liquid crystal display device can be improved.

Further, in the liquid crystal display device shown in FIG. 13, the light-blocking film 423 and the coloring film 451 are not formed over the same substrate. Therefore, it is not necessary to increase the area of the light-blocking film 423 in order to prevent misalignment of a mask in formation of the coloring film 451, which can increase the aperture ratio of a pixel.

(Embodiment 5)

By being provided with a light-emitting element without providing the alignment film 411, the element substrate 413 or 455 described in Embodiment 4 can be used for a light-emitting display device or a light-emitting device. As for a light-emitting display device or a light-emitting device, a light-emitting element utilizing electroluminescence is typically given as a light-emitting element. Light-emitting elements utilizing electroluminescence are classified according to whether a light-emitting material is an organic compound or an inorganic compound. In general, the former is referred to as organic EL elements and the latter as inorganic EL elements.

In the light-emitting display device or the light-emitting device of this embodiment, a thin film transistor with a large on-current, a high field effect mobility, and a small off-current is used as a pixel transistor; therefore, the light-emitting display device or the light-emitting device can have a favorable image quality (for example, a high contrast) and low power consumption.

(Embodiment 6)

A display device including the thin film transistor according to any of the above embodiments can be applied to a variety of electronic devices (including an amusement machine). Examples of the electronic devices are a television device (also referred to as a television or a television receiver), a monitor of a computer or the like, an electronic paper, a camera such as a digital camera or a digital video camera, a digital photo frame, a mobile phone (also referred to as a mobile telephone or a mobile phone device), a portable game console, a portable information terminal, an audio reproducing device, and a large-sized game machine such as a pachinko machine. In particular, a liquid crystal display device, a light-emitting device, an electrophoretic display device, or the like to which the thin film transistor according to any of the above embodiments is applied as described in Embodiments 4 and 5 can be used for a display portion of an electronic device. Specific examples will be described below.

A semiconductor device including the thin film transistor according to any of the above embodiments can be applied to an electronic paper. An electronic paper can be used for electronic devices of a variety of fields as long as they can display data. For example, an electronic paper can be applied to an electronic book (e-book) device, a poster, an advertisement in a vehicle such as a train, a digital signage, a public information display (PID), displays of various cards such as a credit card, and the like. One example of the electronic devices is shown in FIG. 14A.

FIG. 14A shows an example of an electronic book device. The electronic book device shown in FIG. 14A includes two housings, a housing 1500 and a housing 1501. The housing 1500 and the housing 1501 are combined with a hinge 1504 so that the electronic book device can be opened and closed with the hinge 1504. With such a structure, the electronic book device can operate like a paper book.

A display portion 1502 and a display portion 1503 are incorporated in the housing 1500 and the housing 1501, respectively. The display portion 1502 and the display portion 1503 may display one image or may display different images. When the display portion 1502 and the display portion 1503 display different images, for example, a display portion on the right side (the display portion 1502 in FIG. 14A) can display text and a display portion on the left side (the display portion 1503 in FIG. 14A) can display graphics.

FIG. 14A shows an example in which the housing 1500 is provided with an operation portion and the like. For example, the housing 1500 is provided with a power switch 1505, an operation key 1506, a speaker 1507, and the like. With the operation key 1506, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Furthermore, the electronic book device shown in FIG. 14A may serve as an electronic dictionary.

The electronic book device shown in FIG. 14A may transmit and receive data wirelessly. Through wireless communication, desired book data or the like can be purchased and downloaded from an electronic book server.

FIG. 14B shows an example of a digital photo frame. For example, in the digital photo frame shown in FIG. 14B, a display portion 1512 is incorporated in a housing 1511. The display portion 1512 can display a variety of images, for example, image data taken with a digital camera or the like, so that the digital photo frame can function in a manner similar to a general picture frame.

Note that the digital photo frame shown in FIG. 14B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing image data taken with a digital camera is inserted into the storage medium insertion portion of the digital photo frame, and the image data is loaded to be displayed on the display portion 1512.

The digital photo frame shown in FIG. 14B may transmit and receive data wirelessly. A structure may be employed in which desired image data is loaded wirelessly to be displayed.

FIG. 14C shows an example of a television device. In the television device shown in FIG. 14C, a display portion 1522 is incorporated in a housing 1521. The display portion 1522 can display an image. Further, the housing 1521 is supported by a stand 1523 in FIG. 14C. Any of the display devices described in Embodiments 4 and 5 can be applied to the display portion 1522.

The television device can be operated with an operation switch of the housing 1521 or a separate remote controller. Channels and volume can be controlled by an operation key of the remote controller, so that an image displayed on the display portion 1522 can be controlled. Further, the remote controller may be provided with a display portion for displaying data output from the remote controller.

Note that the television device is preferably provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 14D shows an example of a mobile phone. The mobile phone shown in FIG. 14D is provided with a display portion 1532 incorporated in a housing 1531, operation buttons 1533 and 1537, an external connection port 1534, a speaker 1535, a microphone 1536, and the like. Any of the display devices described in Embodiments 4 and 5 can be applied to the display portion 1532.

The display portion 1532 of the mobile phone shown in FIG. 14D is a touchscreen. When the display portion 1532 is touched with a finger or the like, contents displayed in the display portion 1532 can be controlled. Further, operations such as making calls and composing mails can be performed by touching the display portion 1532 with a finger or the like.

There are mainly three screen modes of the display portion 1532. The first mode is a display mode mainly for displaying an image. The second mode is an input mode mainly for inputting data such as text. The third mode is a display-and-input mode in which two modes of the display mode and the input mode are combined.

For example, in making calls and composing mails, a text input mode mainly for inputting text is selected for the display portion 1532, and input operation may be performed by touching characters displayed on a screen. In that case, it is preferable to display a keyboard or number buttons on a large area of the screen of the display portion 1532.

When a detection device including a sensor for detecting inclination, such as a gyroscope or an acceleration sensor, is provided inside the mobile phone, the mode (or display data) of the display portion 1532 can be automatically switched by determining the orientation of the mobile phone (whether the mobile phone is placed horizontally or vertically for a landscape mode or a portrait mode).

Further, the screen modes are switched by touching the display portion 1532 or operating the operation button 1537 of the housing 1531. Alternatively, the screen modes can be switched depending on kinds of images displayed on the display portion 1532. For example, when a signal of an image displayed on the display portion is the one of moving image data, the screen mode can be switched to the display mode. When the signal is the one of text data, the screen mode can be switched to the input mode.

Further, in the input mode, when input by touching the display portion 1532 is not performed for a certain period while a signal detected by an optical sensor in the display portion 1532 is detected, the screen mode may be controlled so as to be switched from the input mode to the display mode.

The display portion 1532 may function as an image sensor. For example, an image of a palm print, a fingerprint, or the like is taken by an image sensor when the display portion 1532 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in appropriate combination with the structures described in the other embodiments.

EXAMPLE 1

In this example, a result of calculating dissociation rate constants of silane will be described with reference to FIG. 15 and FIG. 16. Silane is dissociated at the first electrode as described in Embodiment 1.

Figure 15:
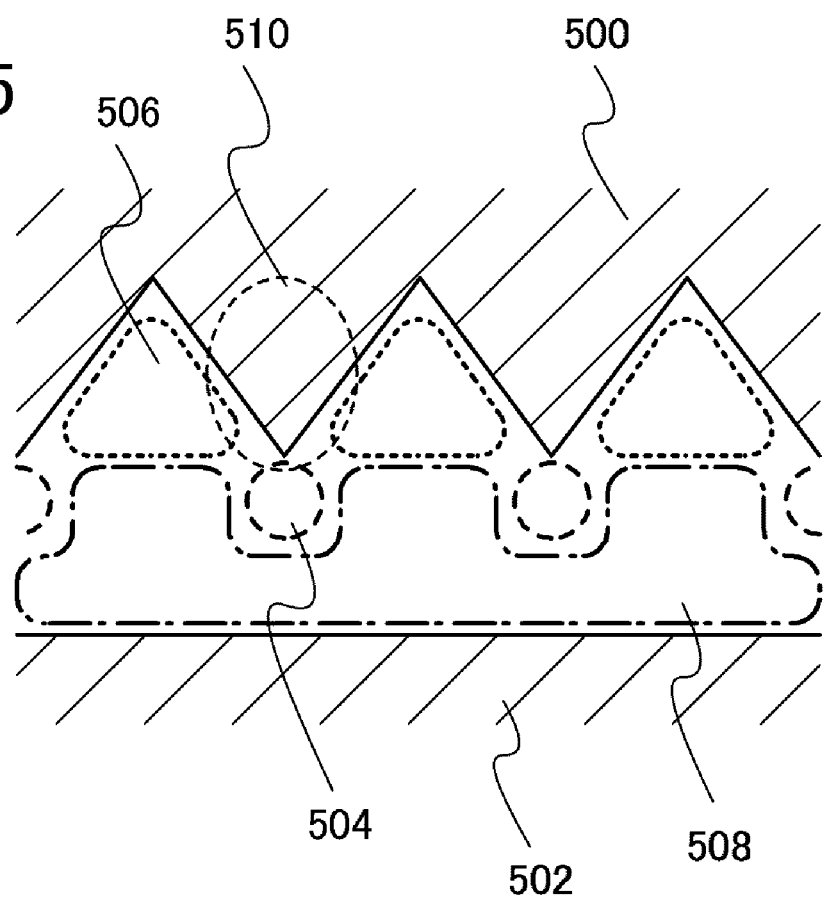
FIG. 15 is a view illustrating distribution of electromagnetic fields by simulation.

FIG. 15 shows a result of calculating the intensity of an electromagnetic field of when high-frequency power is supplied to a first electrode 500. For the calculation, CST MICROSTRIPES™ (by CST-Computer Simulation Technology AG) was used as an electromagnetic simulator. A projecting electrode 510 was formed with a conical shape of which the radius of the bottom surface was 20 mm and the height was 40 mm. In addition, the shortest distance from the tip of the projecting electrode 510 to a second electrode 502 was 20 mm. An electric power with a frequency of 13.56 MHz was supplied to the first electrode 500, and thus, glow discharge was caused between the first electrode 500 and the second electrode 502.

As shown in FIG. 15, it is found that a high-level electric field 504 was produced at the tip of the projecting electrode 510 of the first electrode 500, and a low-level electric field 506 was produced at the bottom of the projecting electrode 510. Furthermore, a middle-level electric field 508 was produced on the second electrode 502 side. That is, a high-density plasma region can be formed at the tip of the projecting electrode 510. Note that the high-level electric field 504 is 10 to 100 times stronger than the low-level electric field 506.

Next, dissociation of a silane gas in plasma in which the electric field intensity is not uniform is described with reference to FIG. 16. The number (generation rate) of reactions in which a silane gas is dissociated by colliding with electrons per unit time and unit volume is referred to as G. G is in proportion to a dissociation rate constant, silane molecular density, and electron density as in Equation 1. Therefore, dissociations of the silane gas are compared depending on the dissociation rate constants of the silane gas.

$$G = kN_{gas}N_e \quad \text{(Equation 1)}$$

(k is a dissociation rate constant, $N_{gas}$ is silane molecular density, and $N_e$ is electron density.)

Figure 16:
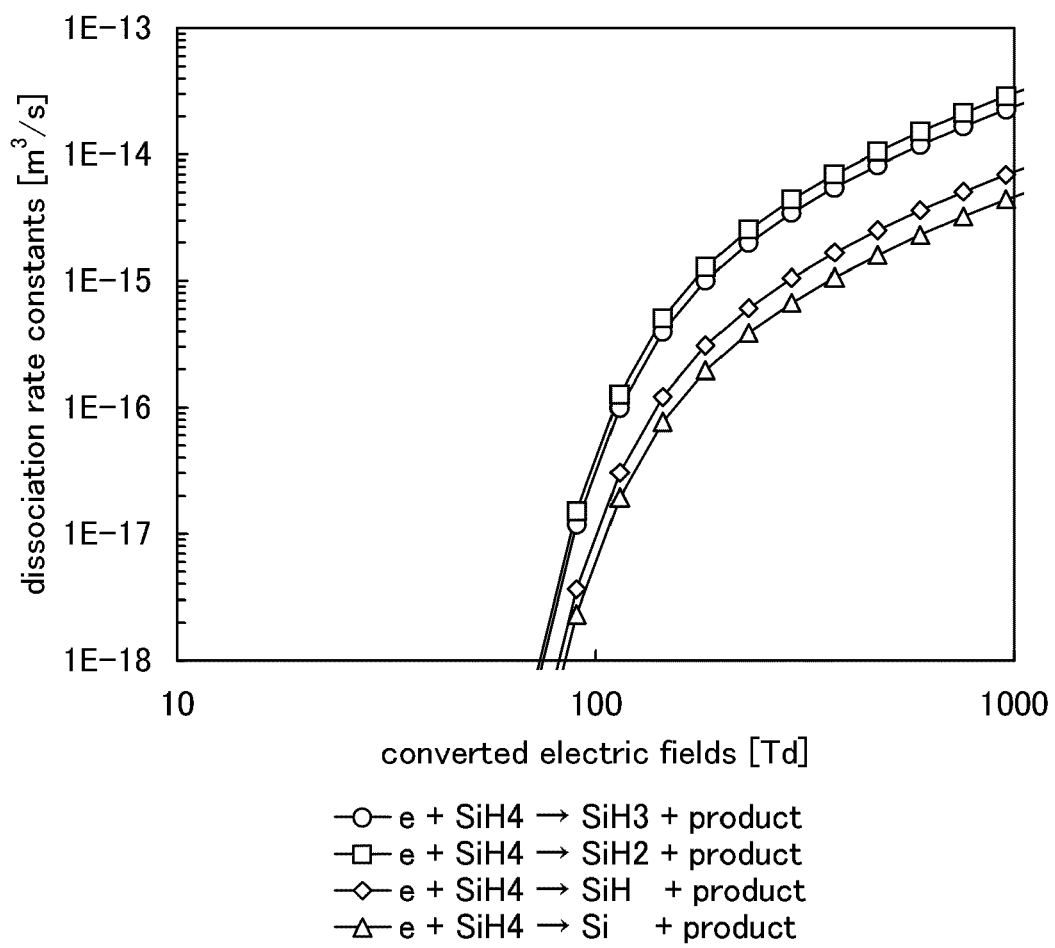
FIG. 16 is a graph showing a dissociation rate constant with respect to a converted electric field by simulation.

FIG. 16 shows dissociation rate constants of a Si radical, a SiH radical, a $SiH_2$ radical, and a $SiH_3$ radial for given converted electric fields. Note that the dissociation rate constants were calculated from the area of a collision cross-section of monosilane. The converted electric field is a ratio of the electric field intensity to the molecular density of the gas. CFD-ACE+ (by CFD Research Corporation) was used as a simulator for the calculation. The calculation was performed under the condition that the pressure was 1 Torr (133.322 Pa) and the temperature of the silane gas was 300 K. Since the reaction velocity of radical species generated in a first-order reaction due to electron collision was not always clear, it was presumed that dissociation due to electron collision was caused at a ratio of $SiH_3$ radical:$SiH_2$ radical:SiH radical:Si radical=36:46:11:7 according to the ion-core model (presumption that a pattern of dissociation to $SiH_n$ (n is 3 or more) is the same as a pattern of dissociation to $SiH^+_n$ (n is 3 or more)). Although an electron swarm parameter in a DC electric field was obtained in this example, the result can be applied to plasma simulation in an AC electric field (such as inductively coupled plasma).

As shown in FIG. 16, when the electric field intensity in plasma significantly varies depending on the region, the dissociation rate of the silane gas changes depending on the converted electric field. The silane gas is not dissociated with an energy which is lower than a threshold energy which is needed for dissociation, which means that the dissociation does not occur with a low converted electric field. However, in a region with a high converted electric field, the silane gas is dissociated with a high percentage due to electron collision. Since the high-level electric field 504 shown in FIG. 15 is 10 to 100 times stronger than the low-level electric field 506, the silane gas is dissociated due to electron collision with a high percentage in the high-level electric field 504. The dissociation rate constants of the $SiH_3$ radical and the $SiH_2$ radical are particularly high, so that the $SiH_3$ radical and the $SiH_2$ radical are likely to be generated in the region with a high converted electric field.

Accordingly, it is found that a number of $SiH_3$ radicals and $SiH_2$ radicals are generated at the tip of the projecting electrode 510 which can generate the high-level electric field 504 as shown in FIG. 15. In addition, highly reactive $SiH_3$ radicals and $SiH_2$ radicals promote nucleation and growth of crystal particles, which allows crystal particles to be easily formed in the high-level electric field 504 at the tip of the projecting electrode 510.

This application is based on Japanese Patent Application serial no. 2009-184856 filed with Japan Patent Office on Aug. 7, 2009, the entire contents of which are hereby incorporated by reference.

What is claimed is:

1. A method for manufacturing a microcrystalline semiconductor film, comprising:
   introducing a first deposition gas containing silicon or germanium into a treatment chamber of a plasma CVD apparatus only from a plurality of projecting portions of an electrode provided in the treatment chamber and introducing a second deposition gas containing hydrogen into the treatment chamber of the plasma CVD apparatus only from a plate electrode member;
   supplying high-frequency power, thereby forming crystal particles over a substrate; and
   forming the microcrystalline semiconductor film over the crystal particles by a plasma CVD method,
   wherein the plurality of projecting portions of the electrode is projected from a surface of the plate electrode member.

2. A method for manufacturing a thin film transistor, comprising:
   forming the microcrystalline semiconductor film over a gate insulating film formed over a gate electrode by the method for manufacturing the microcrystalline semiconductor film according to claim 1; and
   forming a wiring connected to the microcrystalline semiconductor film.

3. The method for manufacturing the microcrystalline semiconductor film, according to claim 1, further comprising introducing a third deposition gas containing silicon or germanium into the treatment chamber of the plasma CVD apparatus from the plate electrode member after forming the crystal particles.

4. A method for manufacturing a microcrystalline semiconductor film, comprising:
   introducing a first deposition gas containing silicon or germanium into a treatment chamber of a plasma CVD apparatus only from a plurality of projecting portions of an electrode provided in the treatment chamber and introducing a second deposition gas containing hydrogen into the treatment chamber of the plasma CVD apparatus only from a plate electrode member;
   supplying high-frequency power;
   generating plasma at the plurality of projecting portions, thereby forming crystal particles over a substrate; and
   forming the microcrystalline semiconductor film over the crystal particles by a plasma CVD method,
   wherein the plurality of projecting portions of the electrode is projected from a surface of the plate electrode member.

5. A method for manufacturing a thin film transistor, comprising:
   forming the microcrystalline semiconductor film over a gate insulating film formed over a gate electrode by the method for manufacturing the microcrystalline semiconductor film according to claim 4; and
   forming a wiring connected to the microcrystalline semiconductor film.

6. The method for manufacturing the microcrystalline semiconductor film, according to claim 4, further comprising introducing a third deposition gas containing silicon or germanium into the treatment chamber of the plasma CVD apparatus from the plate electrode member after forming the crystal particles.

7. A method for manufacturing a microcrystalline semiconductor film, comprising:
   introducing a first deposition gas containing silicon or germanium into a treatment chamber of a plasma CVD apparatus only from a plurality of projecting portions of an electrode provided in the treatment chamber and introducing a second deposition gas containing hydrogen into the treatment chamber of the plasma CVD apparatus only from a plate electrode member;
   supplying high-frequency power, thereby forming crystal particles over a substrate;
   introducing a deposition gas containing silicon or germanium into the treatment chamber from a plurality of gas supply ports between the plurality of projecting portions; and
   supplying high-frequency power, thereby forming the microcrystalline semiconductor film over the crystal particles,
   wherein the plurality of projecting portions of the electrode is projected from a surface of the plate electrode member.

8. The method for manufacturing the microcrystalline semiconductor film, according to claim 7, wherein hydrogen is introduced into the treatment chamber with the deposition gas containing silicon or germanium from the plurality of gas supply ports between the plurality of projecting portions.

9. The method for manufacturing the microcrystalline semiconductor film, according to claim 7, wherein hydrogen and a rare gas are introduced into the treatment chamber with the deposition gas containing silicon or germanium from the plurality of gas supply ports between the plurality of projecting portions.

10. A method for manufacturing a thin film transistor, comprising:
    forming the microcrystalline semiconductor film over a gate insulating film formed over a gate electrode by the method for manufacturing the microcrystalline semiconductor film according to claim 7; and
    forming a wiring connected to the microcrystalline semiconductor film.

11. The method for manufacturing the microcrystalline semiconductor film, according to claim 7, further comprising introducing a third deposition gas containing silicon or germanium into the treatment chamber of the plasma CVD apparatus from the plate electrode member after forming the crystal particles.

12. A method for manufacturing a microcrystalline semiconductor film, comprising:
   introducing a first deposition gas containing silicon or germanium into a treatment chamber of a plasma CVD apparatus only from a plurality of projecting portions of an electrode provided in the treatment chamber and introducing a second deposition gas containing hydrogen into the treatment chamber of the plasma CVD apparatus only from a plate electrode member;
   supplying high-frequency power;
   generating plasma at the plurality of projecting portions, thereby forming crystal particles over a substrate;
   introducing a deposition gas containing silicon or germanium into the treatment chamber from a plurality of gas supply ports between the plurality of projecting portions; and
   supplying high-frequency power, thereby forming the microcrystalline semiconductor film over the crystal particles,
   wherein the plurality of projecting portions of the electrode is projected from a surface of the plate electrode member.

13. The method for manufacturing the microcrystalline semiconductor film, according to claim 12, wherein hydrogen is introduced into the treatment chamber with the deposition gas containing silicon or germanium from the plurality of gas supply ports between the plurality of projecting portions.

14. The method for manufacturing the microcrystalline semiconductor film, according to claim 12, wherein hydrogen and a rare gas are introduced into the treatment chamber with the deposition gas containing silicon or germanium from the plurality of gas supply ports between the plurality of projecting portions.

15. A method for manufacturing a thin film transistor, comprising:
   forming the microcrystalline semiconductor film over a gate insulating film formed over a gate electrode by the method for manufacturing the microcrystalline semiconductor film according to claim 12; and
   forming a wiring connected to the microcrystalline semiconductor film.

16. The method for manufacturing the microcrystalline semiconductor film, according to claim 12, further comprising introducing a third deposition gas containing silicon or germanium into the treatment chamber of the plasma CVD apparatus from the plate electrode member after forming the crystal particles.

* * * * *